United States Patent
Costa et al.

(10) Patent No.: US 9,142,304 B2
(45) Date of Patent: Sep. 22, 2015

(54) ERASE OPERATION FOR 3D NON-VOLATILE MEMORY WITH CONTROLLABLE GATE-INDUCED DRAIN LEAKAGE CURRENT

(71) Applicant: SanDisk Technologies Inc., Plano, TX (US)

(72) Inventors: Xiying Costa, San Jose, CA (US); Haibo Li, Sunnyvale, CA (US); Masaaki Higashitani, Cupertino, CA (US); Man L Mui, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/631,080

(22) Filed: Feb. 25, 2015

(65) Prior Publication Data

US 2015/0170748 A1     Jun. 18, 2015

Related U.S. Application Data

(62) Division of application No. 13/450,313, filed on Apr. 18, 2012, now Pat. No. 9,019,775.

(51) Int. Cl.
*G11C 11/34*      (2006.01)
*G11C 16/14*      (2006.01)
(Continued)

(52) U.S. Cl.
CPC ............ *G11C 16/14* (2013.01); *G11C 16/0483* (2013.01); *G11C 16/3445* (2013.01)

(58) Field of Classification Search
CPC .. G11C 16/14; G11C 16/344; G11C 16/3445; G11C 16/345

USPC ............... 365/185.22, 185.29, 185.3, 185.03
See application file for complete search history.

(56) References Cited

U.S. PATENT DOCUMENTS 6,987,696 B1   1/2006   Wang et al.
7,251,161 B2   7/2007   Yano et al.
(Continued)

FOREIGN PATENT DOCUMENTS

WO   WO2006/105120 A1   10/2006
WO   WO2013/095832 A1   6/2013

OTHER PUBLICATIONS

Choi, Yang-Kyu, et al., "Investigation of Gate-Induced Drain Leakage (GIDL) Current in Thin Body Devices: Single-Gate Ultra-Thin Body, Symmetrical Double-Gate, and Asymmetrical Double-Gate MOSFETs," Jpn. J. Appl. Phys., vol. 42, Apr. 2003, pp. 2073-2076.
(Continued)

*Primary Examiner* — Han Yang
(74) *Attorney, Agent, or Firm* — Vierra Magen Marcus LLP

(57) ABSTRACT

An erase operation for a 3D stacked memory device applies an erase pulse which includes an intermediate level (Vgidl) and a peak level (Verase) to a set of memory cells, and steps up Vgidl in erase iterations of the erase operation. Vgidl can be stepped up when a specified portion of the cells have reached the erase verify level. In this case, a majority of the cells may have reached the erase verify level, such that the remaining cells can benefit from a higher gate-induced drain leakage (GIDL) current to reached the erase verify level. Verase can step up before and, optionally, after Vigdl is stepped up, but remain fixed while Vgidl is stepped. Vgidl can be stepped up until a maximum allowed level, Vgidl_max, is reached. Vgidl may be applied to a drain-side and/or source-side of a NAND string via a bit line or source line, respectively.

8 Claims, 26 Drawing Sheets

(51) Int. Cl.
*G11C 16/34* (2006.01)
*G11C 16/04* (2006.01)

(56) References Cited

U.S. PATENT DOCUMENTS

| | | | |
|---|---|---|---|
| 7,372,741 B2 | 5/2008 | Seki et al. | |
| 7,400,537 B2 | 7/2008 | Hemink et al. | |
| 7,403,424 B2 | 7/2008 | Hemink et al. | |
| 7,408,804 B2 | 8/2008 | Hemink et al. | |
| 7,457,166 B2 | 11/2008 | Hemink et al. | |
| 7,486,564 B2 | 2/2009 | Hemink et al. | |
| 7,495,954 B2 | 2/2009 | Ito | |
| 7,499,317 B2 | 3/2009 | Ito | |
| 7,606,100 B2 | 10/2009 | Hemink et al. | |
| 7,768,826 B2 | 8/2010 | Ito | |
| 7,852,675 B2 | 12/2010 | Maejima | |
| 7,881,114 B2 | 2/2011 | Park et al. | |
| 7,924,622 B2 | 4/2011 | Lee et al. | |
| 7,936,004 B2 | 5/2011 | Kito et al. | |
| 8,036,044 B2 | 10/2011 | Dong et al. | |
| 8,488,382 B1 | 7/2013 | Li et al. | |
| 8,787,094 B2 | 7/2014 | Costa et al. | |
| 8,879,333 B2 | 11/2014 | Costa et al. | |
| 2003/0235080 A1 | 12/2003 | Yaegashi et al. | |
| 2008/0019164 A1* | 1/2008 | Hemink et al. | 365/100 |
| 2009/0310422 A1* | 12/2009 | Edahiro et al. | 365/185.22 |
| 2009/0310425 A1 | 12/2009 | Sim et al. | |
| 2010/0172189 A1 | 7/2010 | Itagaki et al. | |
| 2010/0202206 A1 | 8/2010 | Seol et al. | |
| 2010/0232224 A1 | 9/2010 | Maeda et al. | |
| 2011/0013461 A1 | 1/2011 | Shino et al. | |
| 2011/0063914 A1 | 3/2011 | Mikajiri et al. | |
| 2011/0157989 A1 | 6/2011 | Iwata | |
| 2011/0199825 A1 | 8/2011 | Han et al. | |
| 2011/0249503 A1 | 10/2011 | Yamada et al. | |
| 2011/0267888 A1 | 11/2011 | Dutta et al. | |
| 2012/0051136 A1 | 3/2012 | Kang et al. | |
| 2013/0279257 A1 | 10/2013 | Costa et al. | |
| 2013/0314995 A1 | 11/2013 | Dutta et al. | |
| 2013/0322174 A1 | 12/2013 | Li et al. | |
| 2014/0043916 A1 | 2/2014 | Costa et al. | |
| 2014/0112075 A1 | 4/2014 | Dunga et al. | |

OTHER PUBLICATIONS

International Search Report & The Written Opinion of the International Searching Authority dated Jul. 22, 2013, International Application No. PCT/US2013/036616.

International Search Report & The Written Opinion of the International Searching Authority dated Jul. 18, 2013, International Application No. PCT/US2013/036615.

Restriction Requirement dated Oct. 18, 2013, U.S. Appl. No. 13/450,294, filed Apr. 18, 2012.

Response to Restriction Requirement dated Nov. 8, 2013, U.S. Appl. No. 13/450,294, filed Apr. 18, 2012.

Non-final Office Action dated Jan. 21, 2014, U.S. Appl. No. 13/450,294, filed Apr. 18, 2012.

Response to Office Action dated Mar. 19, 2014, U.S. Appl. No. 13/450,294, filed Apr. 18, 2012.

Notice of Allowance dated Apr. 3, 2014, U.S. Appl. No. 13/450,294, filed Apr. 18, 2012.

Notice of Allowance dated Jun. 26, 2014, U.S. Appl. No. 14/290,224, filed May 29, 2014.

International Preliminary Report on Patentability dated Oct. 21, 2014, International Application No. PCT/US2013/036616.

Objections to the International Preliminary Report on Patentability dated Dec. 5, 2014, European Patent Application No. 13717699.6.

Restriction Requirement dated Nov. 20, 2014, U.S. Appl. No. 13/450,313, filed Apr. 18, 2012.

Response to Restriction Requirement dated Dec. 29, 2014, U.S. Appl. No. 13/450,313, filed Apr. 18, 2012.

Notice of Allowance dated Feb. 5, 2015, U.S. Appl. No. 13/450,313, filed Apr. 18, 2012.

Response to Office Action dated Jun. 11, 2015, European Patent Application No. 13717699.6.

* cited by examiner

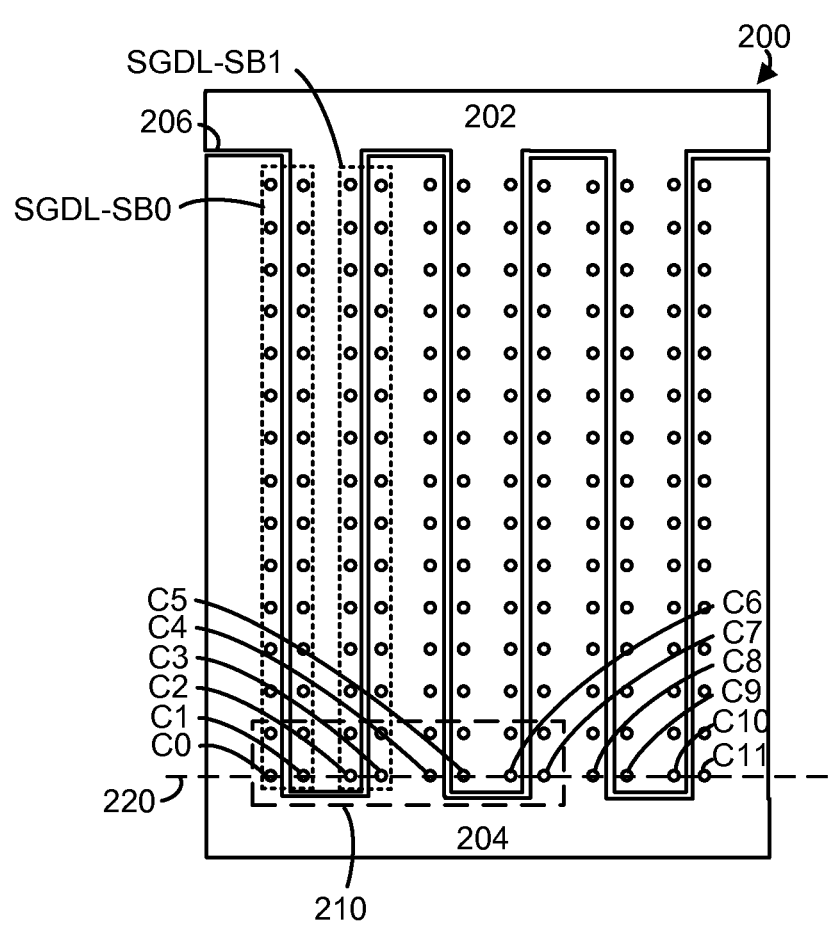

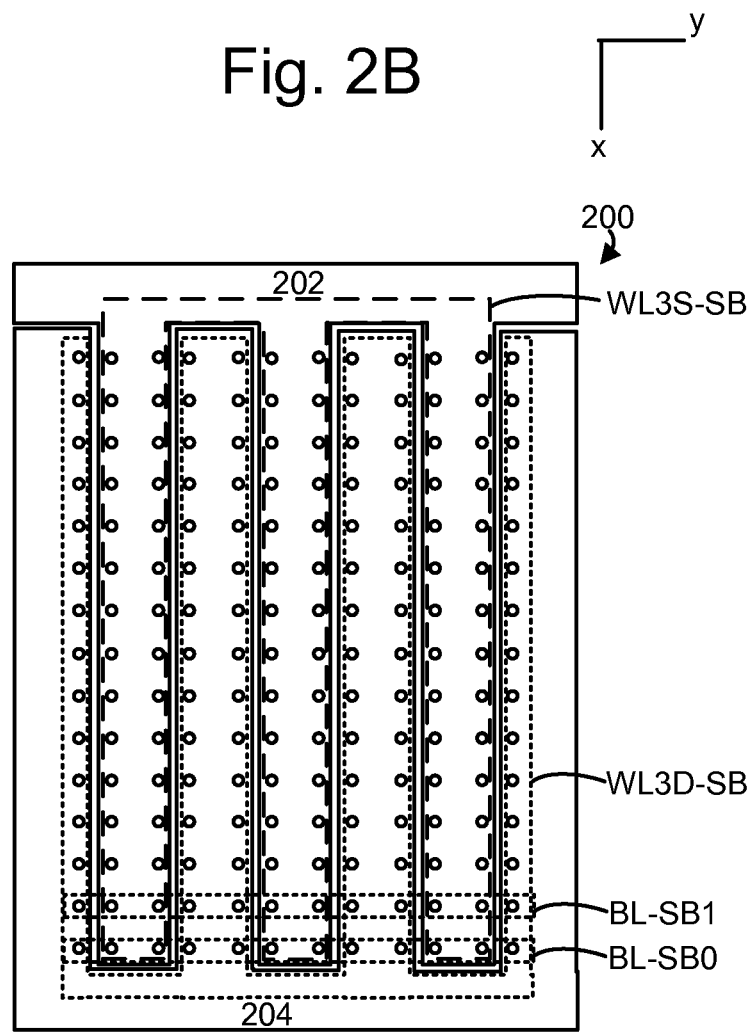

Fig. 4C
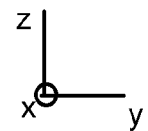
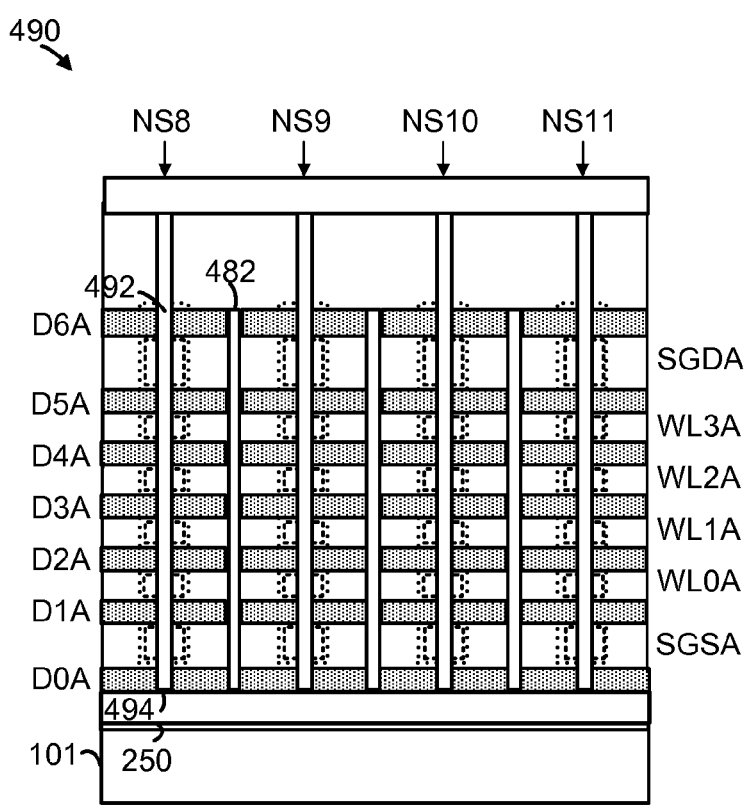

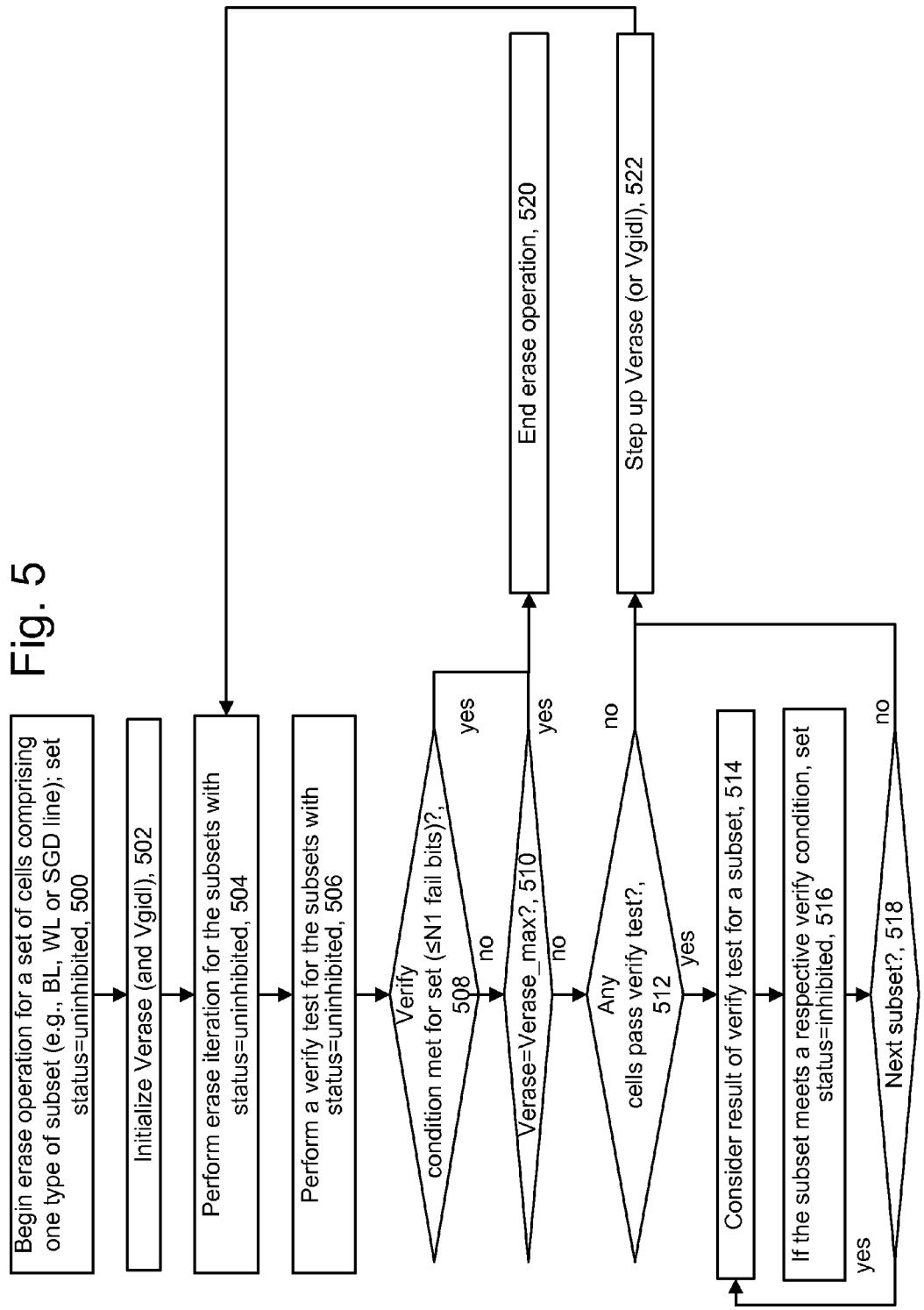

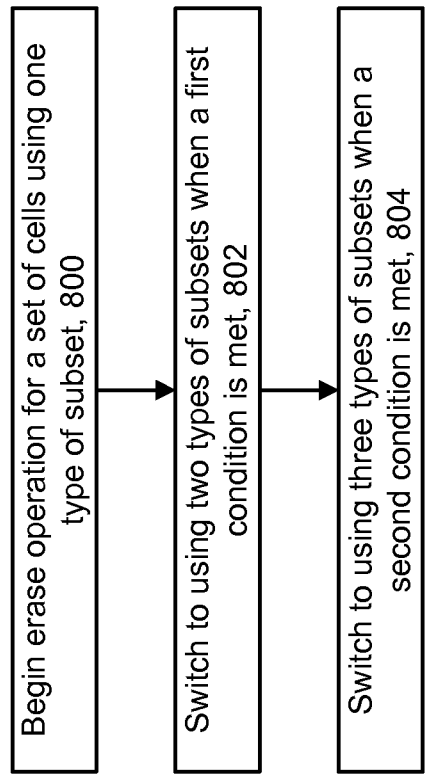

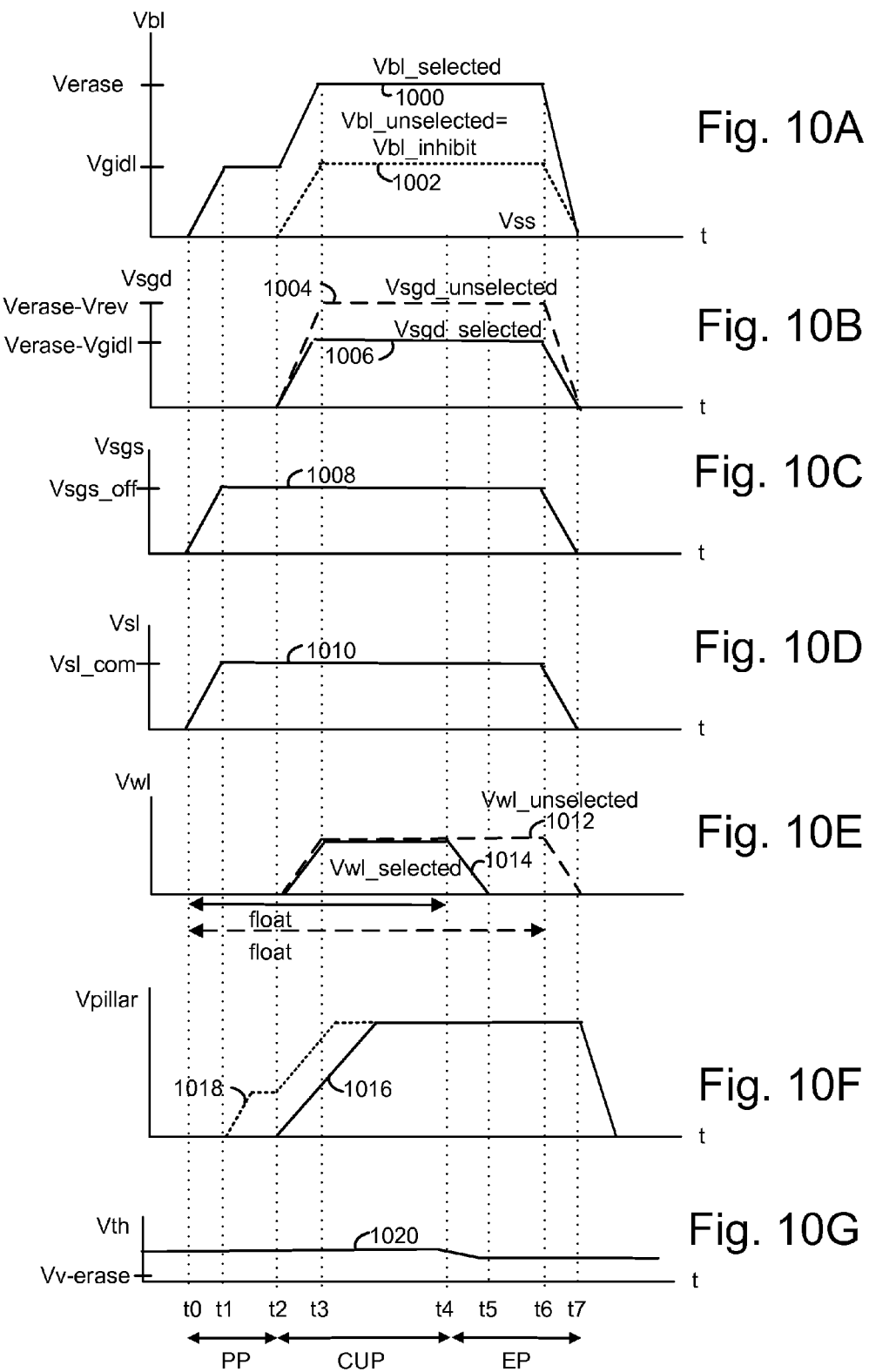

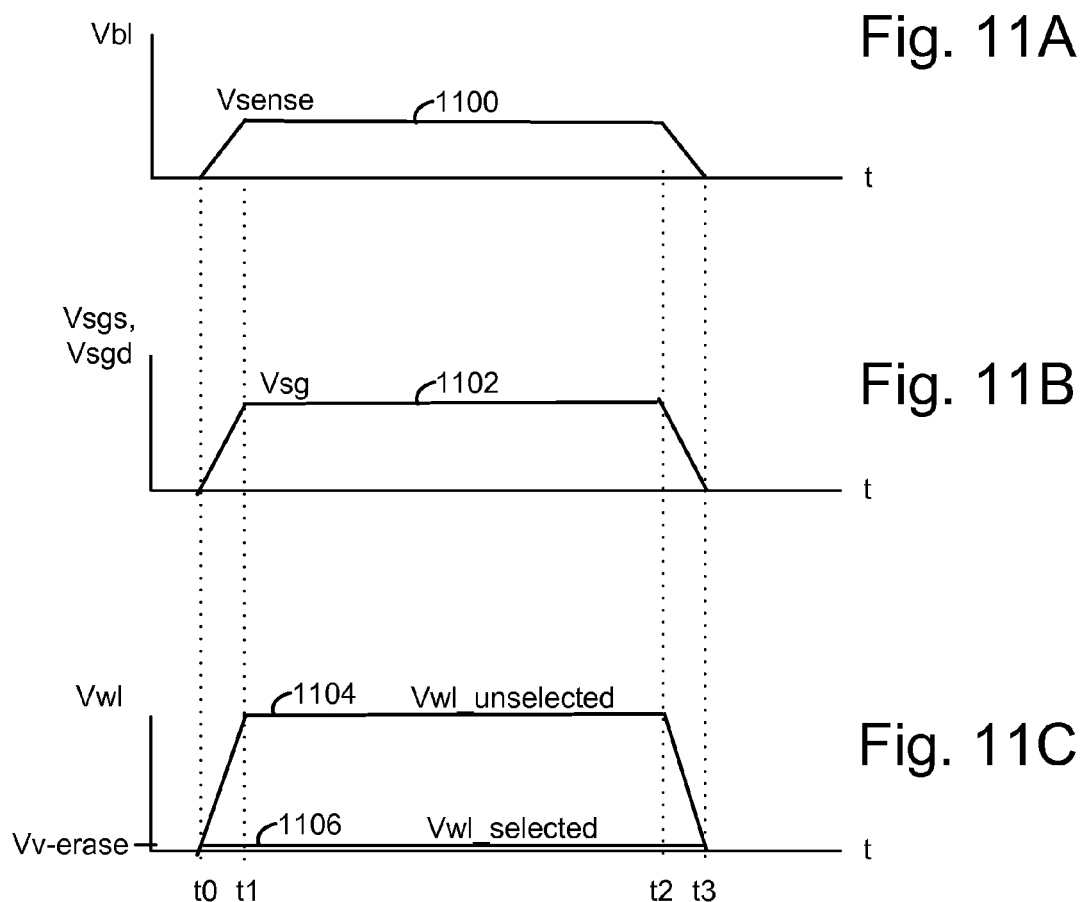

ERASE OPERATION FOR 3D NON-VOLATILE MEMORY WITH CONTROLLABLE GATE-INDUCED DRAIN LEAKAGE CURRENT

CLAIM OF PRIORITY

This application is a divisional application of U.S. patent application Ser. No. 13/450,313, entitled "Erase Operation For 3d Non-Volatile Memory With Controllable Gate-Induced Drain Leakage Current," filed Apr. 18, 2012 and published as US 2013/0279257 on Oct. 24, 2013 and issued as U.S. Pat. No. 9,019,775 on Apr. 28, 2015, and incorporated herein by reference in its entirety.

CROSS-REFERENCE TO RELATED APPLICATIONS

This application is related to U.S. patent application Ser. No. 13/450,294 filed Apr. 18, 2012, titled "Soft Erase Operation For 3D Non-Volatile Memory With Selective Inhibiting Of Passed Bits", issued as U.S. Pat. No. 8,787,094 on Jul. 22, 2014, and incorporated herein by reference.

BACKGROUND OF THE INVENTION

1. Field of the Invention

The present invention relates to techniques for erasing memory cells in a 3D-non-volatile memory device.

2. Description of the Related Art

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

BRIEF DESCRIPTION OF THE DRAWINGS

Like-numbered elements refer to common components in the different figures.

FIG. 2A depicts a top view of a U-shaped NAND embodiment of a block 200, showing example SGD line subsets SGDL-SB0 and SGDL-SB1, as an example implementation of BLK0 in FIG. 1A.

FIG. 2B depicts the block 200 FIG. 2A, showing example word line subsets WL3D-SB and WL3S-SB and example bit line subsets BL-SB0 and BL-SB1.

FIG. 4C depicts a cross-sectional view of the portion 488 of the block 480 of FIG. 4A along line 486.

FIG. 5 depicts a flowchart of an example erase process using selective inhibiting of cells, where there is one type of subset of cells.

FIG. 8 depicts an erase operation in which a number of different types of subsets of memory cells are adjusted in different erase iterations of an erase operation.

FIG. 10A-10I depicts example voltages during the erase portion of an erase-verify iteration of an erase operation.

FIG. 10A depicts example voltages for a bit line, for one- or two-sided erase.

FIG. 10B depicts example voltages for a SGD transistor, for one- or two-sided erase.

FIG. 10C depicts example voltages for a SGS transistor, for one-sided erase.

FIG. 10D depicts example voltages for a SL, for one-sided erase.

FIG. 10E depicts example voltages for a WL, for one- or two-sided erase.

FIG. 10F depicts a pillar voltage, for one- or two-sided erase, showing an option where Vgidl is stepped up (dashed line).

FIG. 10G depicts a threshold voltage (Vth) of a memory cell being erased, for one- or two-sided erase.

FIG. 10H depicts example voltages for a SL, for two-sided erase.

FIG. 10I depicts example voltages for a SGS transistor, for two-sided erase.

FIGS. 11A-11C depict voltages in the verify portion of an erase-verify iteration of an erase operation.

FIG. 11A depicts a bit line voltage 1100.

FIG. 11B depicts a SGS transistor and SGD transistor voltage 1102.

FIG. 11C depicts an unselected word line voltage 1104 and a selected word line voltage 1106.

DETAILED DESCRIPTION

Figure 1A:
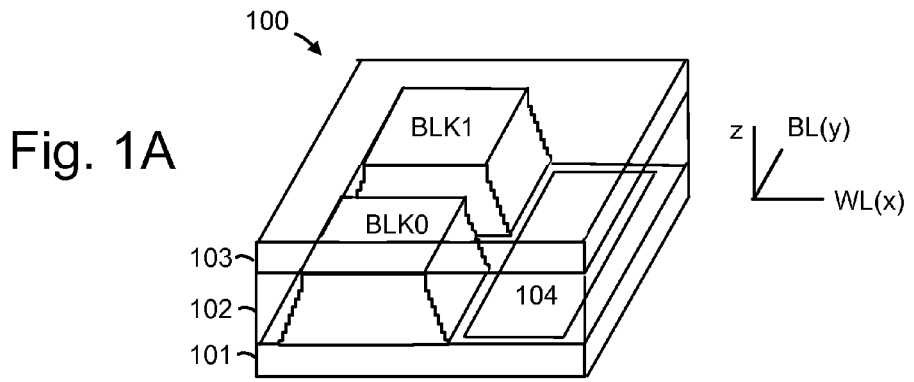
FIG. 1A is a perspective view of a 3D stacked non-volatile memory device.

A 3D stacked non-volatile memory device can be arranged in multiple blocks, where typically an erase operation is performed one block at a time. An erase operation can include multiple erase-verify iterations which are performed until a verify condition is met for the block, at which point the erase operation ends. In one approach, the memory device includes NAND strings which have a drain-side select gate (SGD) transistor on one end and a source-side select gate (SGS) transistor on the other end. The select gate transistors play an important role in an erase operation because they are used to generate a sufficient amount of gate-induced drain leakage (GIDL) current to charge up the floating body of the NAND string in a reasonable time frame. GIDL increases in proportion to the drain-to-gate voltage (Vdg) of the select gate transistors. Various challenges are encountered during an erase operation. For example, excess holes under erased cells should be minimized to avoid trap states which are induced by program-erase (P/E) cycle stress. This stress is caused by a transverse electrical field. To minimize degradation by P/E cycle stress, the presence of excess holes under erased cells can be reduced by erasing the memory cells (reducing their Vth) using an erase verify level (Vv-erase) and then soft programming the memory cells (increasing their Vth) using a soft program verify level (Vv-sgpm). See also FIGS. 9B and 9C. Excess holes are expected to be replaced by electrons during soft programming.

However, a relatively strong erase voltage (e.g., in terms of amplitude and duration) is commonly used to complete the erasing of cells which were programmed to the highest data state and/or slow-erasing cells. Typically, four, eight or sixteen data states can be used. The relatively strong erase voltage which is needed to erase the cells at the highest data states can result in a deep-erase phenomenon caused by over-erase of the cells at the lower data states, and this over-erase may not be repaired completely by the subsequent soft programming. Also, Vv-spgm might need to be raised to allow the soft programming to compensate for the excess holes in the deep erase state. However, increasing Vv-spgm can reduce the Vth budget to below an acceptable level which is needed to implement multi-level cells (MLC) in BiCS technology.

Various erase techniques provided herein inhibit one or more subsets of cells in a set of cells which is being erased. For example, the subsets can be groups of cells associated with a common bit line, a common SGD line or a common word line. Each subset can be inhibited when it meets a verify condition, such as having no more than a maximum allowable number of fail bits. A fail bit can be a memory cell which does not pass a verify test in a given erase-verify iteration, e.g., a memory cell whose Vth is not below Vv-erase.

In another aspect, a situation is addressed in which erase speed might be limited by GIDL current. To address this, a method for performing an erase operation in a 3D stacked non-volatile memory device can apply an erase pulse which includes an intermediate level (Vgidl) and a peak level (Verase), and step up Vgidl in some of the erase iterations of the erase operation. For example, Vgidl can be stepped up when a specified portion of the cells have reached the erase verify level. In this case, a majority of the cells may have reached the erase verify level, such that the remaining cells can benefit from a higher GDL level which is provided by increasing Vgidl.

Figure 9A:
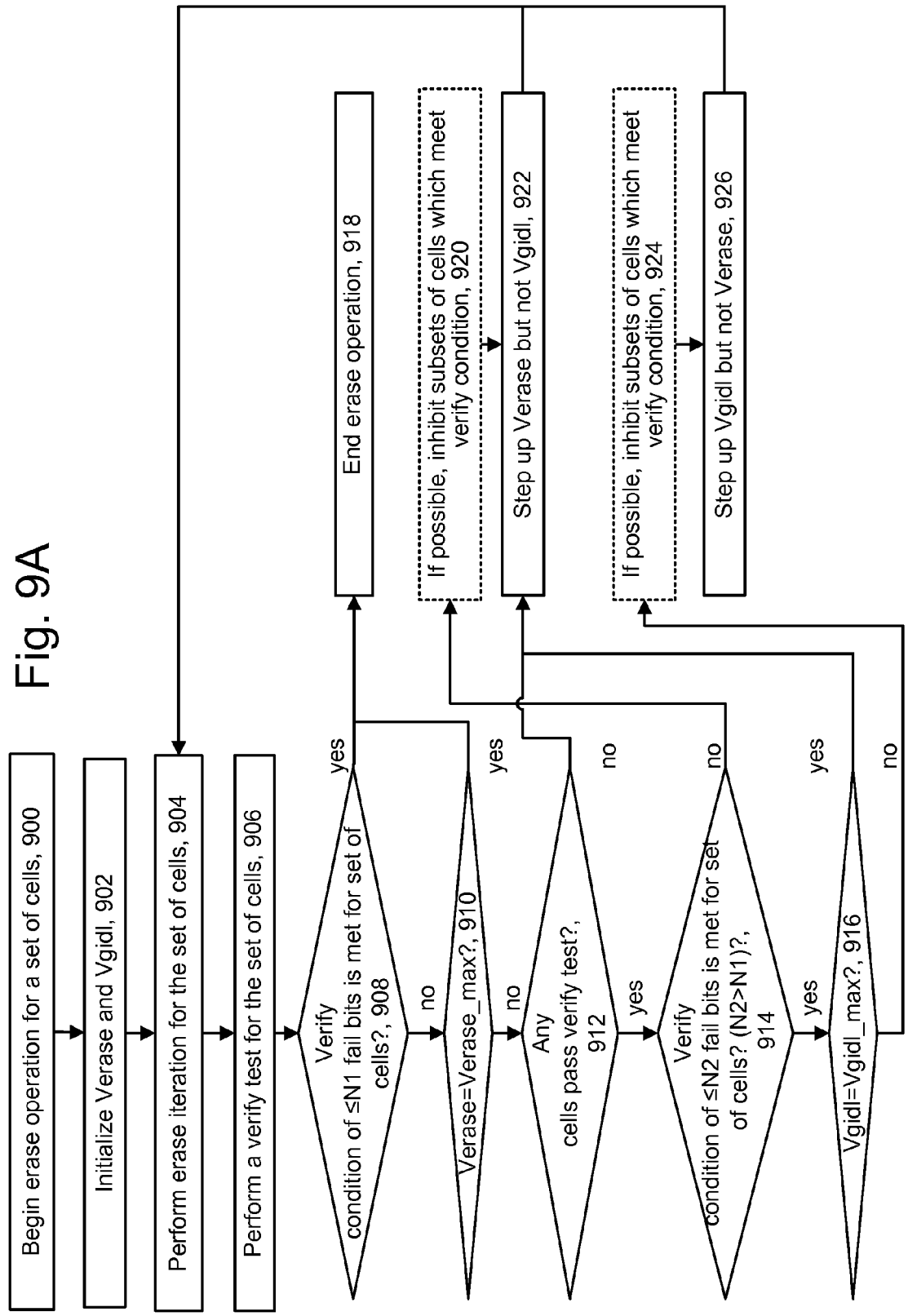
FIG. 9A depicts a flowchart of an example erase process in which Vgidl is stepped up in the erase portion of one or more successive erase-verify iterations.
Figure 9B:
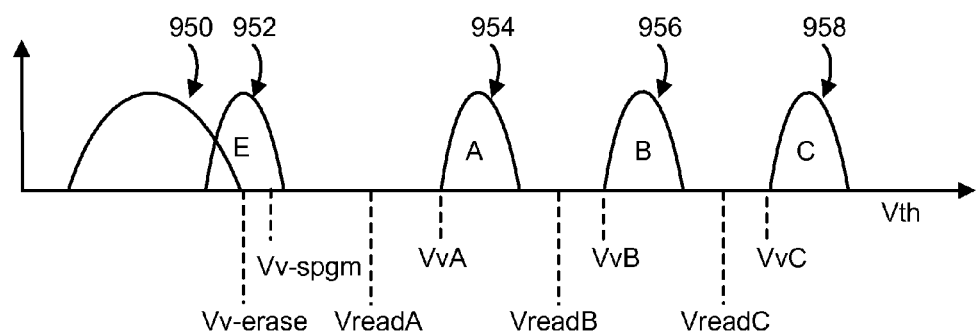
FIG. 9B depicts threshold voltage distributions of a deep erased state, a final erased state and higher data states of one example erase operation.
Figure 9C:
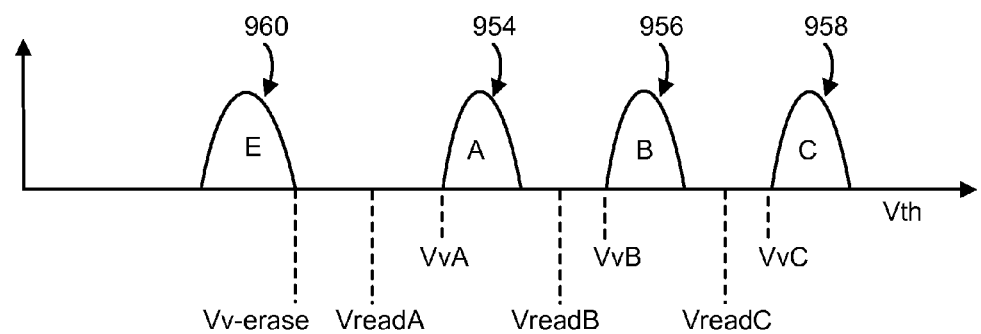
FIG. 9C depicts threshold voltage distributions of a soft erased state and higher data states of another example erase operation.

In the discussion below, FIGS. 1A-4D provide structural details of a 3D stacked non-volatile memory device, FIGS. 5-9A provide flowcharts of example methods of erase operations, FIGS. 9B and 9C provides example Vth distributions, and FIGS. 10-15 provide example waveforms in an erase operation.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
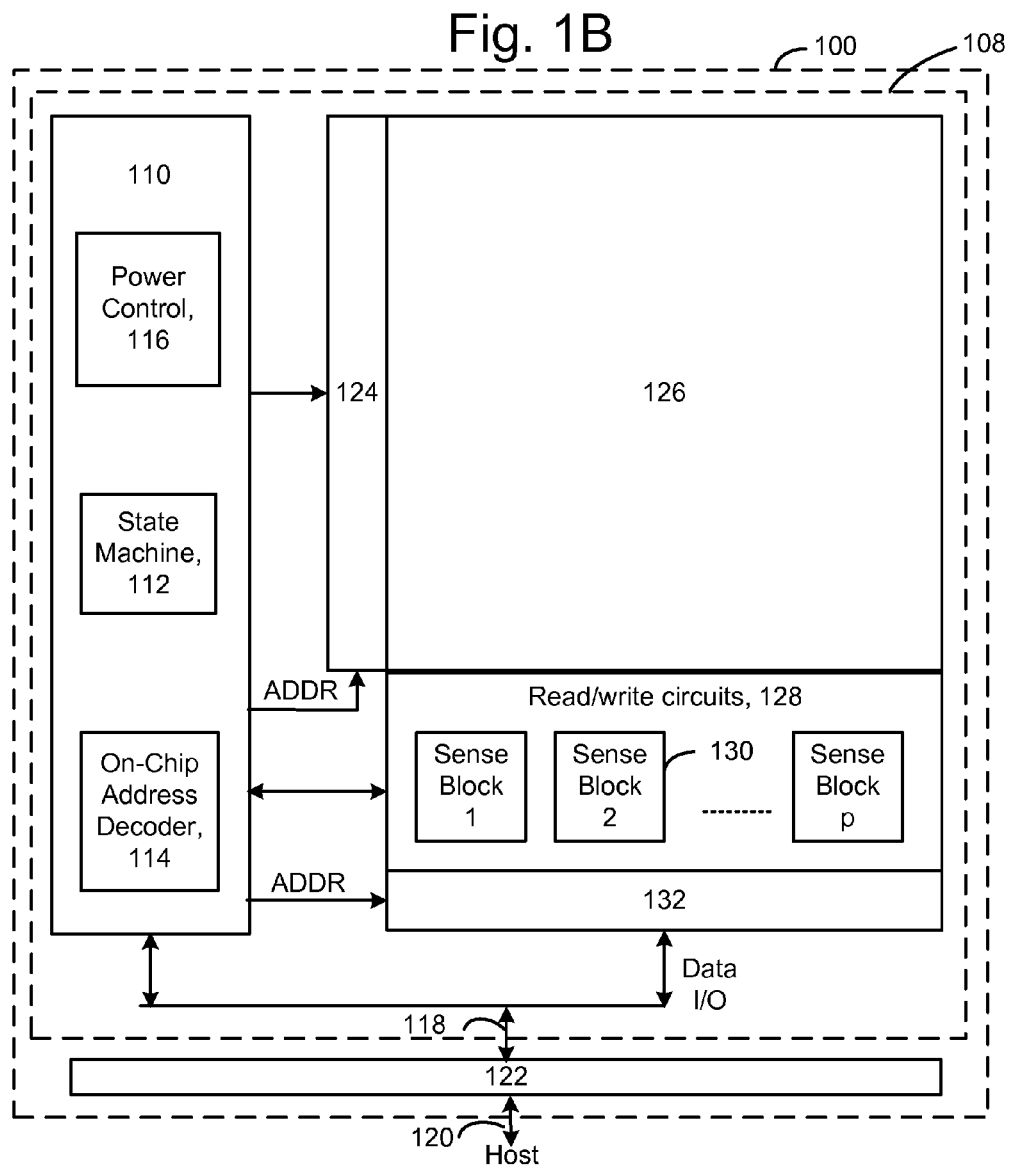
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array of storage elements 126, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page of storage elements to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 130 can include bit line drivers, in one approach.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control 116, sense blocks 130, read/write circuits 128, and controller 122, and so forth.

In another embodiment, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 126. In this way, the density of the read/write modules is reduced by one half Other types of non-volatile memory in addition to NAND flash memory can also be used.

Figure 2C:
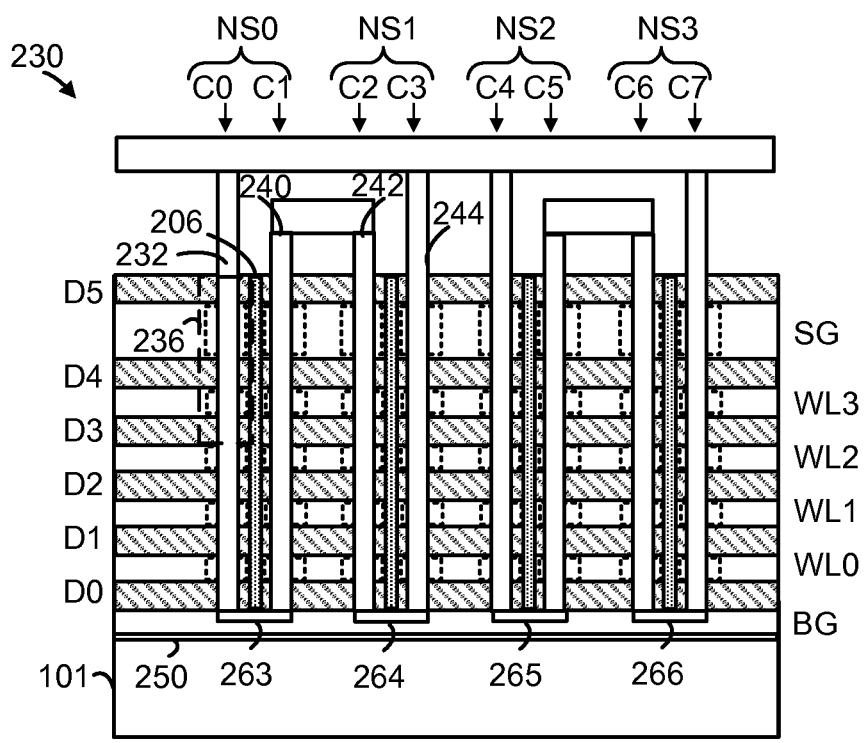
FIG. 2C depicts a cross-sectional view of the portion 210 of the block 200 of FIG. 2A, along line 220.

FIG. 2A depicts a top view of a U-shaped NAND embodiment of a block 200, showing example SGD line subsets SGDL-SB0 and SGDL-SB1, as an example implementation of BLK0 in FIG. 1A. The view is of a representative layer among the multiple word line layers in a stack. Referring also to FIG. 2C, the stack includes alternating dielectric and conductive layers. The dielectric layers include D0 to D5 and may be made of SiO2, for instance. The conductive layers include BG, which is a back gate layer, WL0 to WL3, which form word line layers, e.g., conductive paths to control gates of the memory cells at the layer, and SG, which forms a select gate layer, e.g., a conductive path to control gates of select gate transistors of NAND strings. The word line layer of FIG. 2A may represent any one of WL0 to WL3, for instance. The conductive layers may include doped polysilicon or metal silicide, for instance. An example voltage of 5-10 V may be applied to the back gate to maintain a conductive state which connects the drain- and source-side columns.

For each block, the word line layer is divided into two word line layer portions 202 and 204. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the word line layer portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0 to C11. The figure represents a simplification, as many more rows of memory holes will typically be used, extending to the right and left in the figure. Also, the figures are not necessarily to scale. The columns of memory cells can be arranged in subsets or sub-blocks.

Subsets of memory cells can be of different types, such as WL subsets, SGD line subsets and BL subsets.

FIG. 2B depicts the block 200 FIG. 2A, showing example word line subsets WL3D-SB and WL3S-SB and example bit line subsets BL-SB0 and BL-SB1. This example assumes that the WL3 layer is depicted. WL3S-SB is a word line layer or word line layer portion in communication with one (e.g., exactly one) memory cell in the source-side of each U-shaped NAND string, and WL3D-SB is a word line layer or word line layer portion in communication with one (e.g., exactly one) memory cell in the drain-side of each U-shaped NAND string.

Each subset can be independently inhibited from being erased. For example, a WL subset can be independently inhibited from being erased by floating a voltage of the WL. A SGD line subset can be independently inhibited from being erased by setting a voltage of the SGD line to a sufficiently high (but lower than selected BL bias) level which inhibits erase. If Vdg is small enough not to be able to generate GIDL to charge the unselected channels, the unselected SGD line subset can be inhibited from being erased. Similarly, a BL subset can be independently inhibited from being erased by setting a voltage of the BL to a sufficiently low level which inhibits erase. The term "inhibit erase" or the like refers, e.g., to substantially preventing or not encouraging erase. A "subset" as used herein generally refers to a proper subset. A subset "A" is a proper subset of a set "B" when $A \subset B$ and $A \neq B$. That is, A contains one or more cells which are also contained within B, but A does not contain all cells in B. A contains fewer memory cells than B. Subsets of the same type typically are distinct from one another and do not contain common cells. Subsets of different types can contain one or more common cells.

When U-shaped NAND strings are used, each SGD line subset can include two adjacent rows of columns of memory cells. In a subset, the adjacent rows are separated by the slit. The columns of memory cells on one side of the slit are drain-side columns (e.g., C0, C3, C4 and C7 in FIG. 2C) of NAND strings, and the columns of memory cells on the other side of the slit are source-side columns (e.g., C1, C2, C5 and C6 in FIG. 2C) of the NAND strings. Note that the pattern of two source-side columns between two drain-side columns repeats in the y-direction.

Word line drivers can independently provide signals such as voltage waveforms to the word line layer portions 202 and 204.

The drawings are not to scale and do not show all memory columns. For example, a more realistic block might have 12 memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assume there are four memory cells per column, so there are 384 k×4=1,536 k or 1,536,000 total cells in the set.

A portion 210 of the block 200 is described further below in connection with FIG. 3A.

FIG. 2C depicts a cross-sectional view of the portion 210 of the block 200 of FIG. 2A, along line 220. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263. NS0 has a drain end 232 and a source end 240. NS1 includes columns C2 and C3 and connecting portion 264. NS1 has a drain end 244 and a source end 242. NS2 includes columns C4 and C5 and connecting portion 265. NS3 includes columns C6 and C7 and connecting portion 266.

The source line SL0 is connected to the source ends 240 and 242 of two adjacent memory strings NS0 and NS1. The source line SL0 is also connected to other sets of memory strings which are behind NS0 and NS1 in the x direction. Recall that additional U-shaped NAND strings in the stack 230 extend behind the U-shaped NAND strings depicted in the cross-section, e.g., along the x-axis, in a SGD line direction. The U-shaped NAND strings NS0 to NS3 are each in a different SGD line subset, but are in a common BL subset.

The slit portion 206 from FIG. 2A is also depicted as an example. In the cross-section, multiple slit portions are seen, where each slit portion is between the drain- and source-side columns of a U-shaped NAND string. A portion of the bit line BL0 is also depicted.

Short dashed lines depict memory cells and select gate transistors, as discussed further below. A region 236 of the stack is shown in greater detail in FIG. 2D.

Figure 2D:
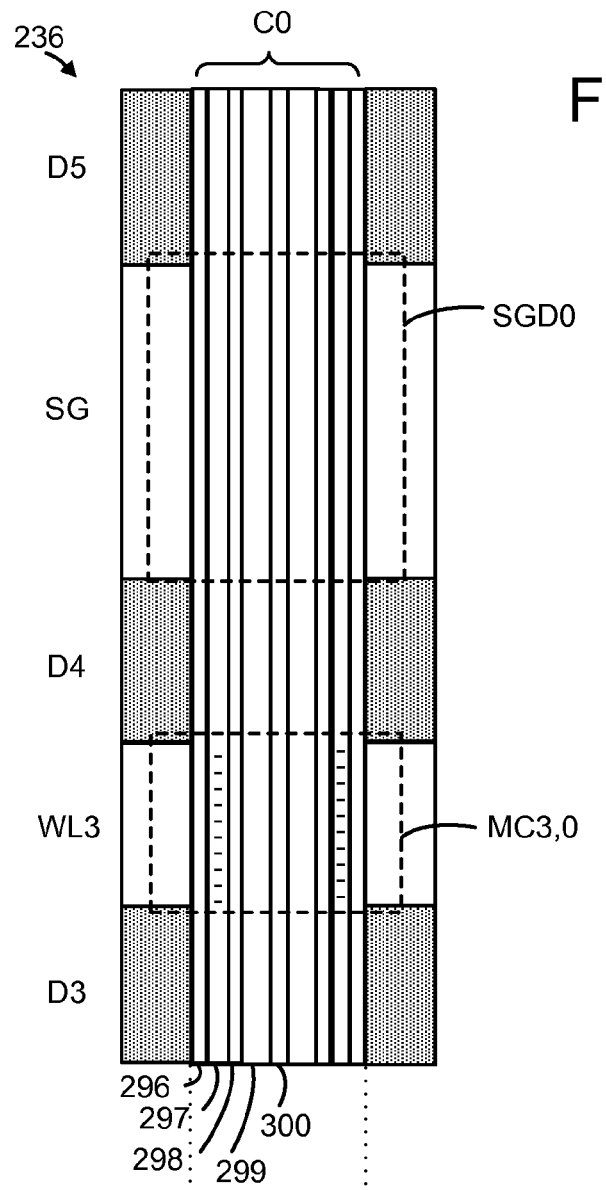
FIG. 2D depicts a close-up view of the region 236 of the column C0 of FIG. 2C, showing a drain-side select gate SGD0 and a memory cell MC303.

FIG. 2D depicts a close-up view of the region 236 of the column C0 of FIG. 2C, showing a drain-side select gate transistor SGD0 and a memory cell MC303. The region shows portions of the dielectric layers D3 to D5 and the conductive layers WL3 and SG. Each column includes a number of layers which are deposited along the sidewalls of the column. These layers can include oxide-nitride-oxide and polysilicon layers which are deposited, e.g., using atomic layer deposition. For example, a block oxide can be deposited as layer 296, a nitride such as SiN as a charge trapping layer can be deposited as layer 297, a tunnel oxide can be deposited as layer 298, a polysilicon body or channel can be deposited as layer 299, and a core filler dielectric can be deposited as region 300. Additional memory cells are similarly formed throughout the columns.

When a memory cell is programmed, electrons are stored in a portion of the charge trapping layer which is associated with the memory cell. For example, electrons are represented by "−" symbols in the charge trapping layer 297 for MC303. These electrons are drawn into the charge trapping layer from the polysilicon body, and through the tunnel oxide. The threshold voltage of a memory cell is increased in proportion to the amount of stored charge. During an erase operation, as discussed further below, e.g., in connection with FIGS. 10A-10I, a voltage in the polysilicon body is raised due to gate-induced drain leakage (GIDL), as mentioned, while a voltage of one or more selected word line layers floats. The voltage of the one or more selected word line layers is then driven down sharply to a low level such as 0 V to create an electric field across the tunnel oxide which causes holes to be injected from the memory cell's body to the charge trapping layer, resulting in a large Vth downshift toward an erase-verify level, Vv-erase. This process can be repeated in successive iterations until a verify condition is met, as discussed further below. For unselected word lines, the word lines are floated but not driven down to a low level so that the electric field across the tunnel oxide is relatively small, and no, or very little, hole tunneling will occur. Memory cells of the unselected word lines will experience little or no Vth downshift, and as a result, they will not be erased.

Figure 2E:
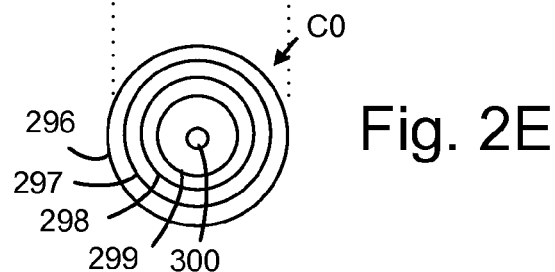
FIG. 2E depicts a cross-sectional view of the column C0 of FIG. 2D.

FIG. 2E depicts a cross-sectional view of the column C0 of FIG. 2D. Each layer is ring-shaped in one possible approach, except the core filler, which is cylindrical.

Figure 3A:
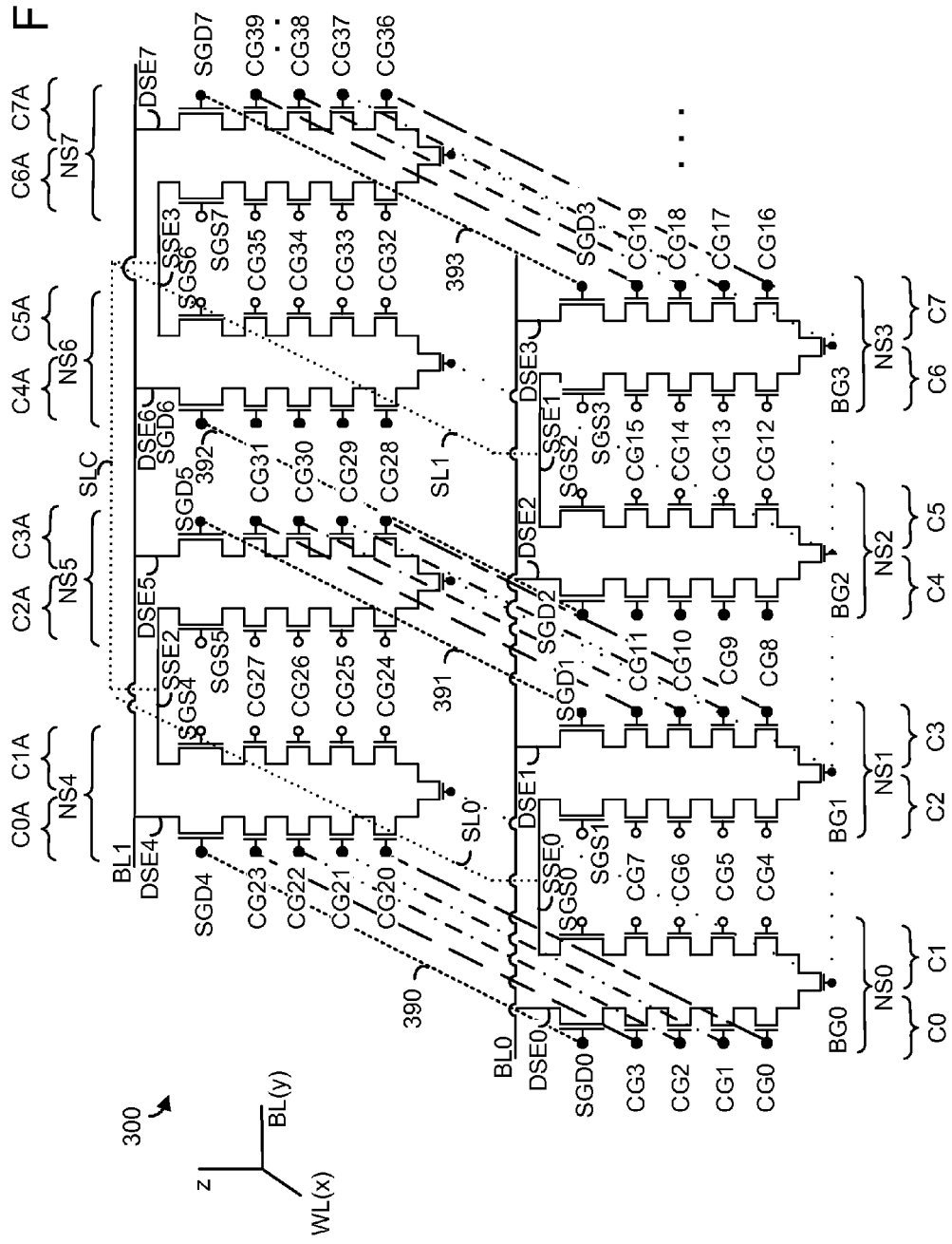
FIG. 3A depicts one embodiment of a circuit 300 showing electrical connections between drain-sides of U-shaped NAND strings, consistent with the portion 210 of the block of FIG. 2A.

FIG. 3A depicts one embodiment of a circuit 300 showing electrical connections between drain-sides of U-shaped NAND strings, consistent with the portion 210 of the block of FIG. 2A. A number of NAND strings NS0 to NS3 are in communication with a bit line BL0, and a number of NAND strings NS4 to NS7 are in communication with a bit line BL1. Each NAND string has a drain-side column with four memory cells and a SGD transistor, and a source-side column with four memory cells and a SGS transistor. For example, on the drain-side, NS0 has CG0-CG3 and SGD0, NS1 has CG8-CG11 and SGD1, NS2 has CG8-CG11 and SGD2, NS3 has CG16-CG19 and SGD3, NS4 has CG20-CG23 and SGD4, NS5 has CG28-CG31 and SGD5, NS6 has CG28-CG31 and SGD6, and NS7 has CG36-CG39 and SGD7. On the source-side, NS0 has CG4-CG7 and SGS0, NS1 has CG4-CG7 and SGS1, NS2 has CG12-CG15 and SGS2, NS3 has CG12-CG15 and SGS3, NS4 has CG24-CG27 and SGS4, NS5 has CG24-CG27 and SGS5, NS6 has CG32-CG35 and SGS6, and NS7 has CG32-CG35 and SGS7. The drain-side columns are C0, C3, C4, C7, C0A, C3A, C4A and C7A for NS0-NS7, respectively. The source-side columns are C1, C2, C5, C6, C1A, C2A, C5A and C6A for NS0-NS7, respectively.

Further, each NAND string has a source-side end (SSE0 shared by NS0 and NS1, SSE1 shared by NS2 and NS3, SSE2 shared by NS4 and NS5, and SSE3 shared by NS6 and NS7) and a drain side end (DSE0 of NS0, DSE1 of NS1, DSE2 of NS2, DSE3 of NS3, DSE4 of NS4, DSE5 of NS5, DSE6 of NS6, and DSE7 of NS7). Each NAND string has a back gate (BG0 for NS0, BG1 for NS1, BG2 for NS2, and BG3 for NS3). The back gates may be connected to one another. A source line SL0 connects SSE0 and SSE2, and a source line SL1 connects SSE1 and SSE3. Optionally, a source line connector (SLC) connects SL0 and SL1. Typically, for one-sided erase, the source lines are tied together and the SLC is used. For, two-sided erase, the source lines are not tied together and the SLC is not used.

Control gates (CG) of the drain-side memory cells are connected to one another by word line layers. For example, CG0-CG3 are connected to CG20-CG23, respectively, CG8-CG11 are connected to CG28-CG31, respectively, and CG16-CG19 are connected to CG36-CG39, respectively. Control gates (CG) of the source-side memory cells are also connected to one another by word line layers. For example, CG4-CG7 are connected to CG24-CG27, respectively, and CG12-CG15 are connected to CG32-CG35, respectively.

Additionally, the drain-side control gates of memory cells at a given level of the stacked 3D memory device are connected to one another. For example, CG0, CG8, CG16, CG20, CG28 and CG36 are connected to one another at the first word line level (WL0). CG1, CG9, CG17, CG21, CG29 and CG37 are connected to one another at the second word line level (WL1). CG2, CG10, CG18, CG22, CG30 and CG38 are connected to one another at the third word line level (WL2). CG3, CG11, CG19, CG23, CG31 and CG39 are connected to one another at the fourth word line level (WL3) (consistent with FIG. 3E).

Additionally, SGD transistor control gates are connected to one another in respective SGD line subsets. For example, SGD0 is connected by SGD line 390 to SGD4, SGD1 is connected by SGD line 391 to SGD5, SGD2 is connected by SGD line 392 to SGD6, and SGD3 is connected by SGD line 393 to SGD7.

In one implementation, SGD transistors in a SGD line subset, e.g., in communication with a common SGD line, are independent from SGD transistors in other SGD line subsets. For example, SGD0 and SGD4 are independent from SGD1 and SGD5, from SGD2 and SGD6 and from SGD3 and SGD7.

Additionally, the source-side control gates of memory cells at a given level of the stacked 3D memory device are connected to one another. For example, CG4, CG12, CG24 and CG32 are connected to one another at the first word line level (WL0). CG5, CG13, CG25 and CG33 are connected to one another at the second word line level (WL1). CG6, CG14, CG26 and CG34 are connected to one another at the third word line level (WL2). CG7, CG15, CG27 and CG35 are connected to one another at the fourth word line level (WL3) (consistent with FIG. 3F).

Figure 3B:
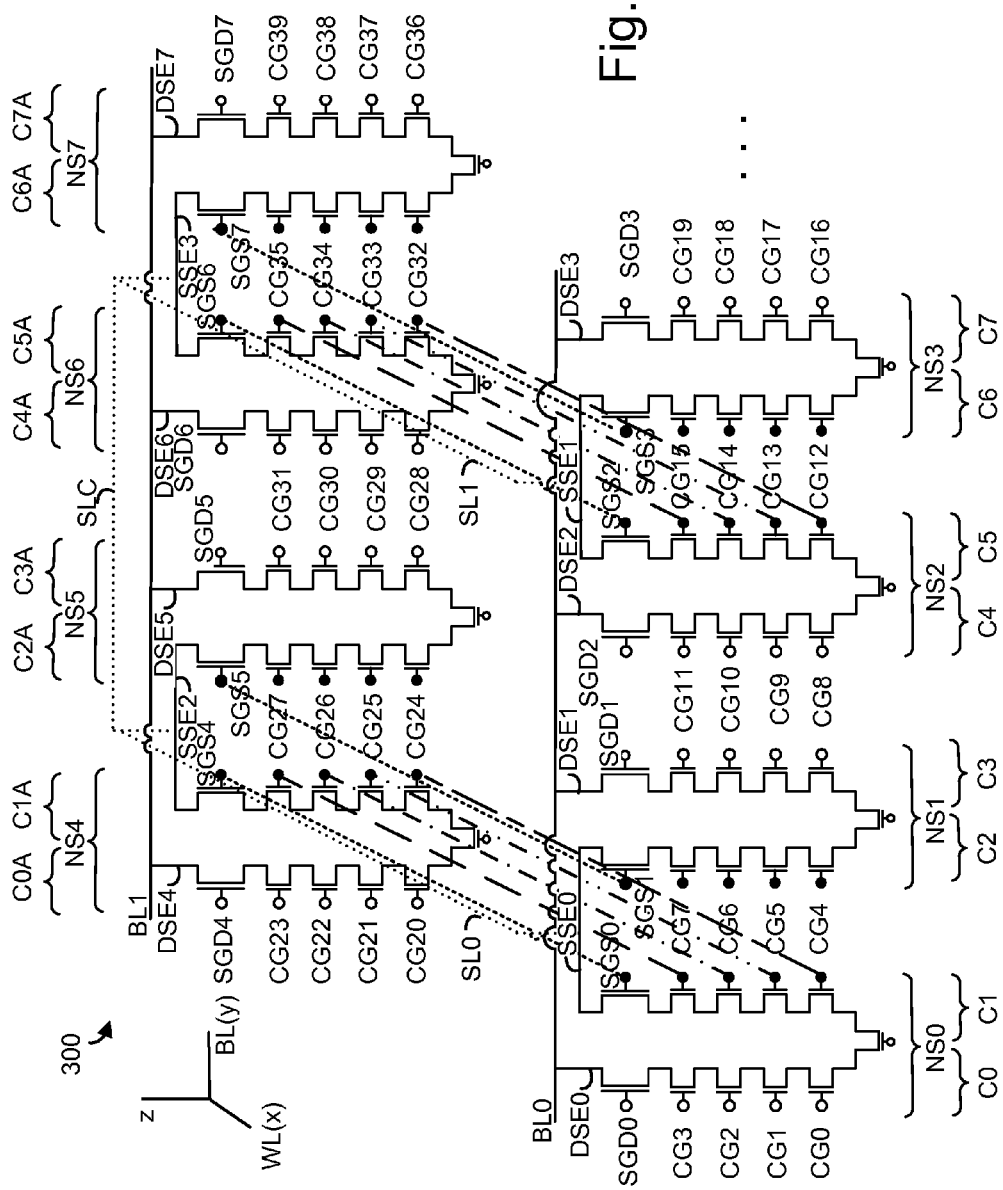
FIG. 3B depicts one embodiment of connections between source-sides of U-shaped NAND strings, consistent with the circuit of FIG. 3A.
Figure 3C:
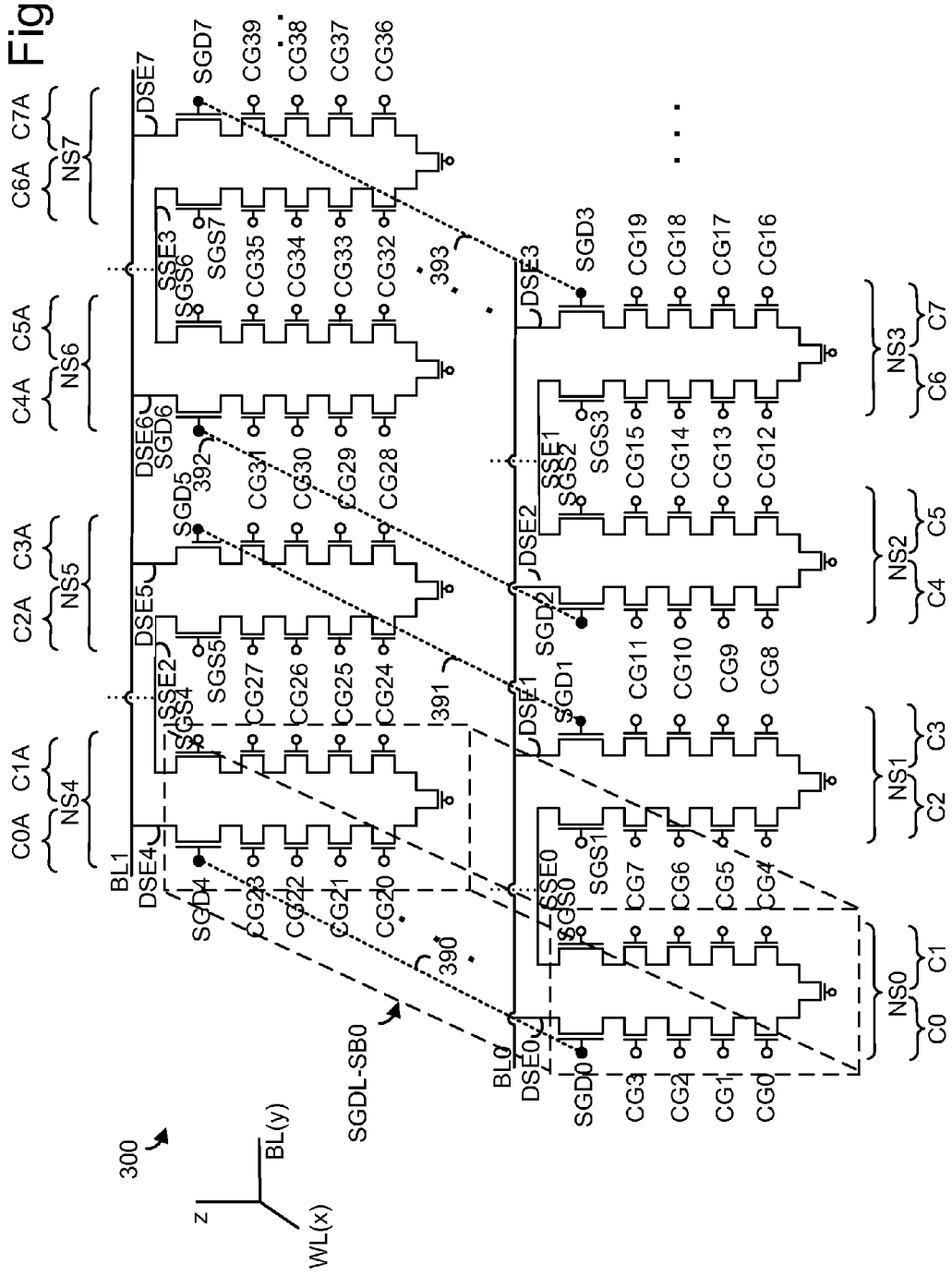
FIG. 3C depicts an example of the SGD line subset SGDL-SB0 of FIG. 2A, consistent with FIGS. 3A and 3B.
Figure 3D:
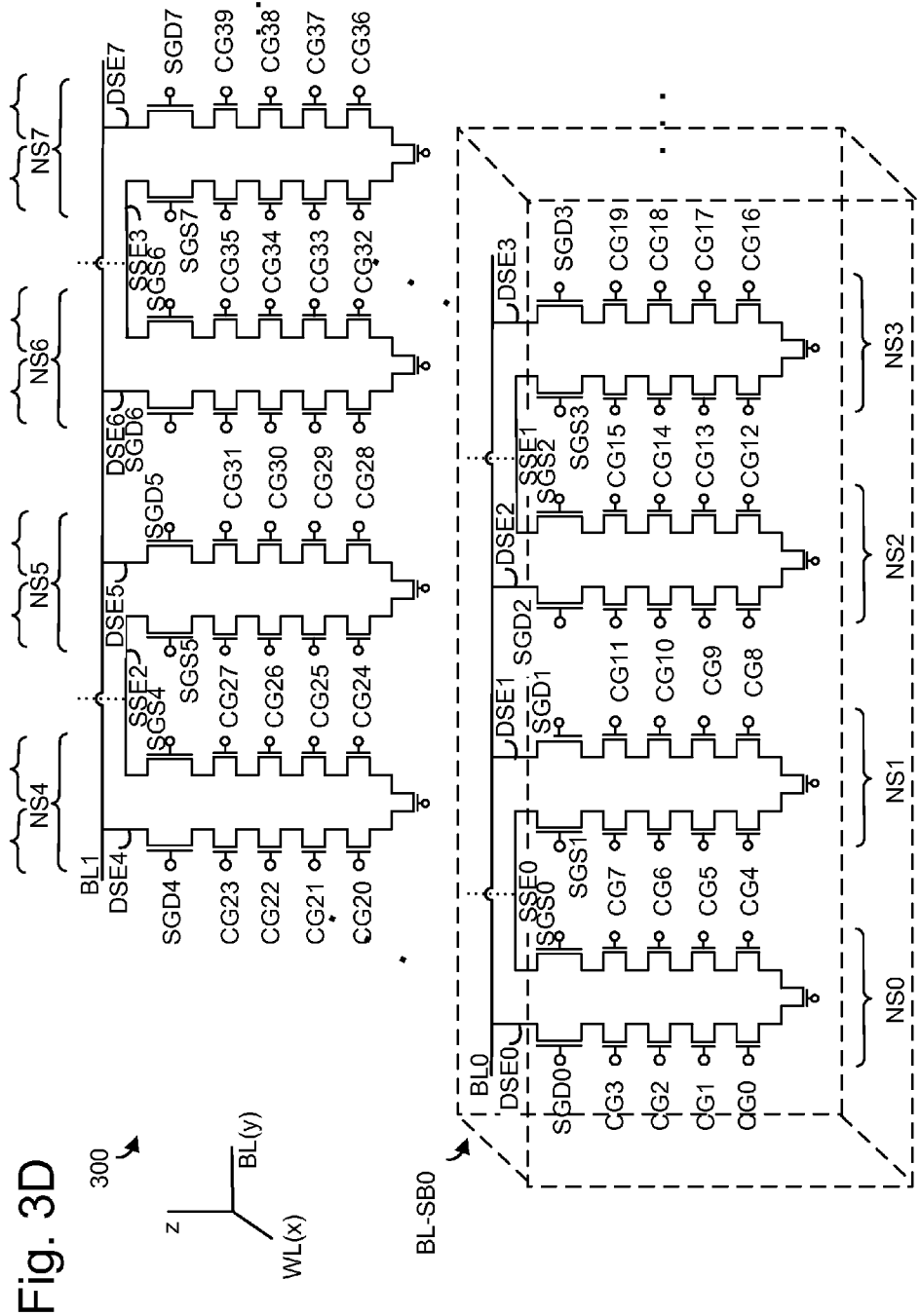
FIG. 3D depicts an example of the bit line subset BL-SB0 of FIG. 2B, consistent with FIGS. 3A and 3B.
Figure 3E:
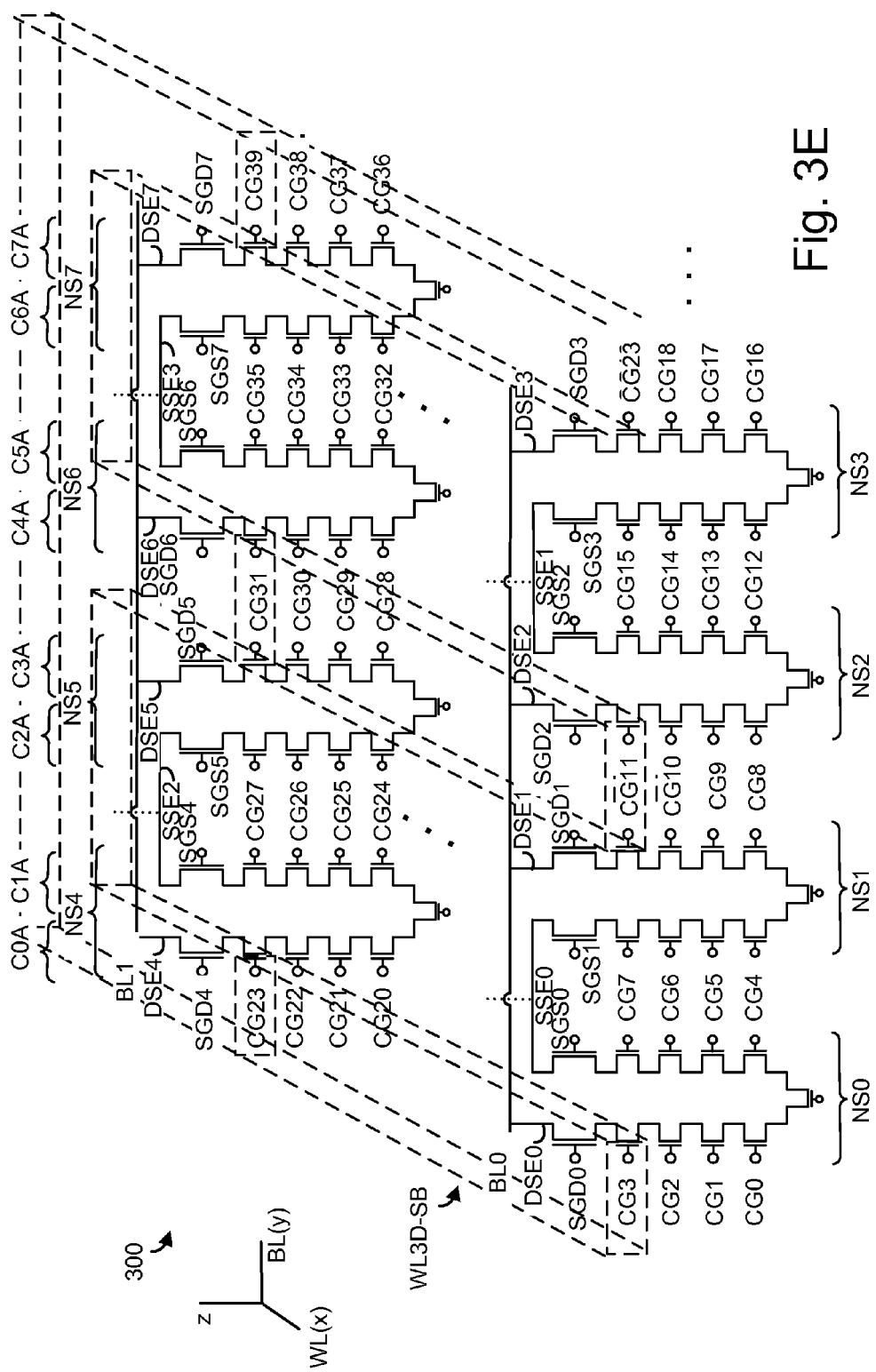
FIG. 3E depicts an example of the word line subset WL3D-SB of FIG. 2B for drain-sides of U-shaped NAND strings, consistent with FIGS. 3A and 3B.
Figure 3F:
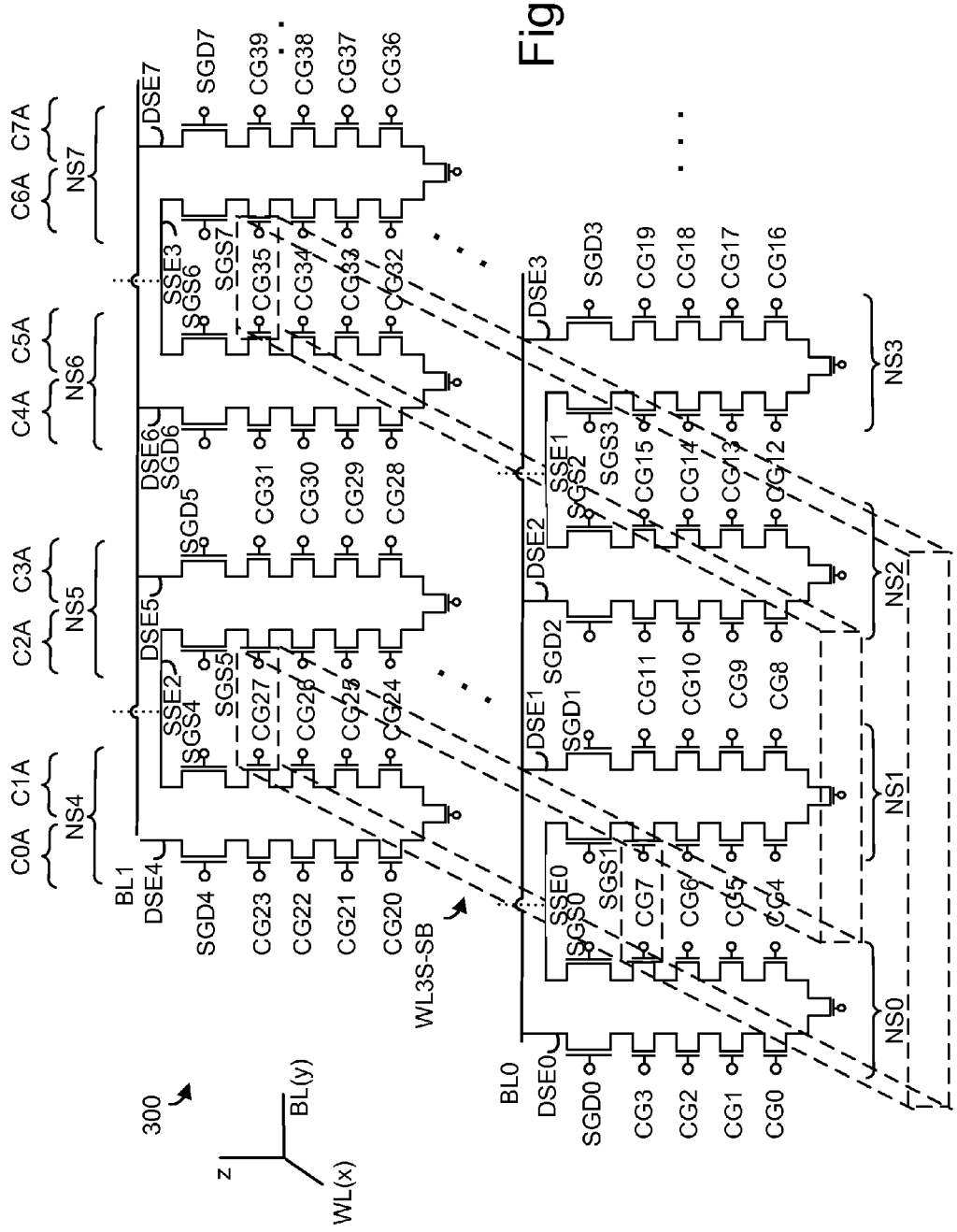
FIG. 3F depicts an example of the word line subset WL3S-SB of FIG. 2B for source-sides of U-shaped NAND strings, consistent with FIGS. 3A and 3B.
Figure 3G:
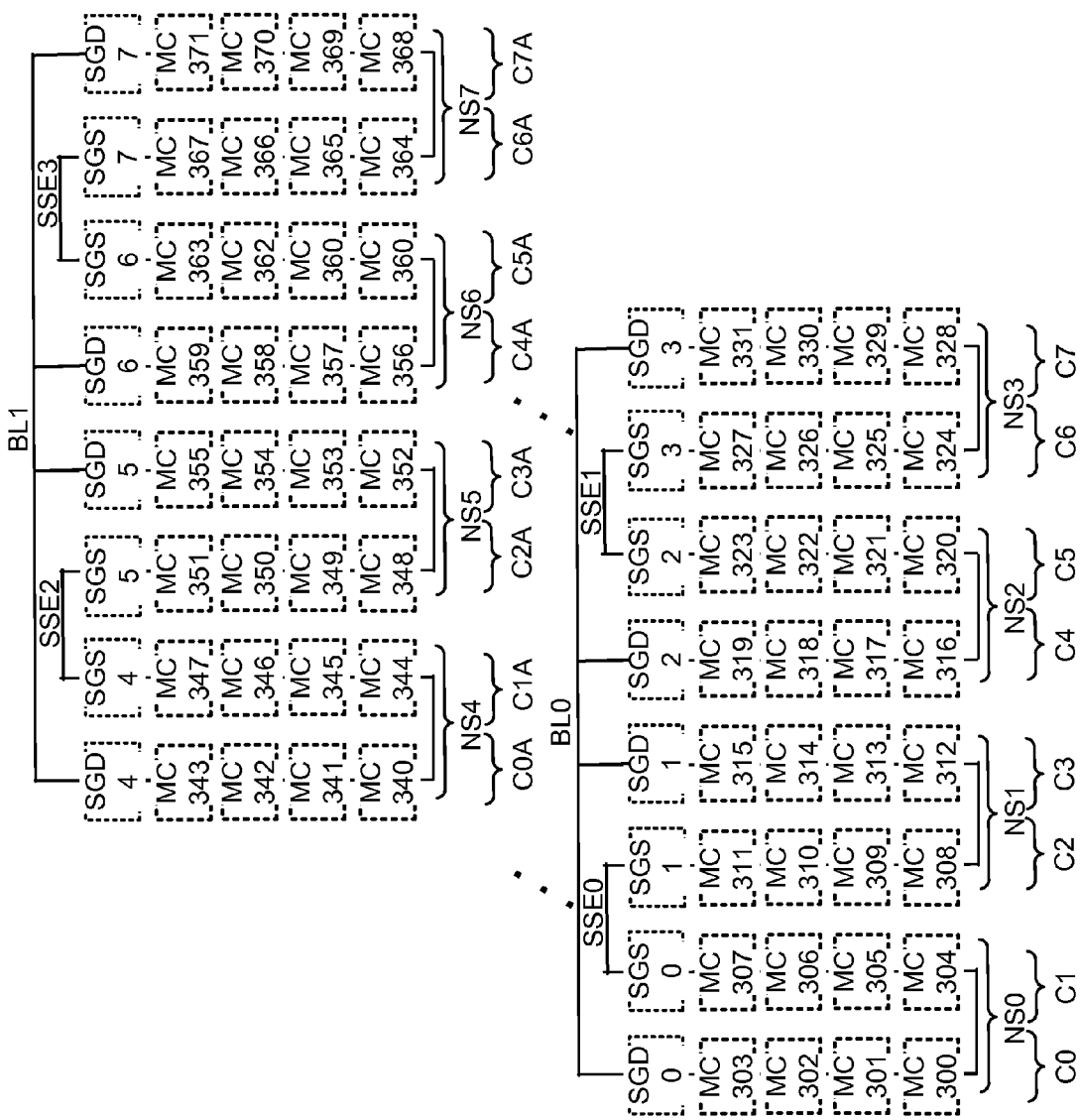
FIG. 3G depicts an example arrangement of memory cells consistent with the circuit of U-shaped NAND strings of FIGS. 3A and 3B.

The control gates are associated with memory cells as can be seen by referring also to FIG. 3G. Specifically, CG0-CG3 are associated with MC300-MC303, respectively. CG4-CG7 are associated with MC304-MC307, respectively, and MC308-MC311, respectively. CG8-CG11 are associated with MC312-MC315, respectively, and MC316-MC319, respectively. CG12-CG15 are associated with MC320-MC323, respectively, and MS324-MC327, respectively. CG16-CG19 are associated with MC328-MC321, respectively. Furthermore, CG20-CG23 are associated with MC340-MC343, respectively. CG24-CG27 are associated with MC344-MC347, respectively, and MC348-MC351, respectively. CG28-CG31 are associated with MC352-MC355, respectively, and MS356-MC359, respectively. CG32-CG35 are associated with MC360-MC363, respectively, and MC364-MC367, respectively. CG36-CG39 are associated with MC368-MC371, respectively.

The dark circles indicate drain-side control gates of memory cells and SGD transistors. FIG. 3B depicts one embodiment of connections between source-sides of U-shaped NAND strings, consistent with the circuit of FIG. 3A.

SGS transistor control gates are connected to one another in the x-direction. For example, SGS0 is connected to SGS4, SGS1 is connected to SGS5, SGS2 is connected to SGS6, and SGS3 is connected to SGS7. The dark circles indicate source-side control gates of memory cells and SGS transistors.

The circuit connections of FIGS. 3A and 3B are shown separately for clarity but are provided in a common circuit.

FIG. 3C depicts an example of the SGD line subset SGDL-SB0 of FIG. 2A, consistent with FIGS. 3A and 3B. This subset includes NAND strings which are associated with one (e.g., exactly one) SGD line, e.g., NS0 and NS4 (and any additional NAND strings between them). Other example SGD line subsets can be provided by NS1 and NS5 (and any additional NAND strings between them) in communication with SGD line 391, NS2 and NS6 (and any additional NAND strings between them) in communication with SGD line 392, and NS3 and NS7 (and any additional NAND strings between them) in communication with SGD line 393.

In other words, a SGD line subset includes NAND strings whose SGD transistors are in communication with one (e.g., exactly one) SGD line. The NAND strings of an SGD line subset can be inhibited together from being erased by control of the SGD line. For example, in SGDL-SB0, NS0 and NS4 can be inhibited by controlling SGD line 390.

The NAND strings of one SGD line subset can be inhibited independently from the NAND strings of another SGD line subset. The SGD line is in communication with the SGD transistor of each NAND string in the SGD line subset and can inhibit erase such as by setting a voltage which does not allow GIDL to occur and charge the channel of the NAND string when a bit line voltage is applied to a drain-side end of the NAND strings. For example, SGD line 390 is in communication with SGD0 and SGD4 and can therefore set a voltage at the control gates of these select gate transistors. A SGD transistor can be thought of as a gate between the bit line and the channel of the NAND string.

For example, assume a first SGD line subset has an uninhibited status and is therefore not inhibited from being erased in a current erase iteration, and a second SGD line subset has an inhibited status and is therefore inhibited from being erased in the current erase iteration. When an erase voltage is applied to a bit line to erase memory cells in NAND strings of the first SGD line subset, the SGD line of the first SGD line subset can be controlled to allow charging of the channels of the NAND strings in the first SGD line subset, while the SGD line of the second SGD line subset can be controlled to prevent or discourage charging of the channels of the NAND strings in the second SGD line subset.

FIG. 3D depicts an example of the bit line subset BL-SB0 of FIG. 2B, consistent with FIGS. 3A and 3B.

This subset includes NAND strings which are in communication with one (e.g., exactly one) bit line. The NAND strings of a BL subset can be inhibited together from being erased by control of the BL. The NAND strings of one BL subset can be inhibited independently from the NAND strings of another BL subset. The BL is in communication with the drain-side end of each NAND string in the BL subset and can inhibit erase such as by setting a voltage which does not allow GIDL to occur and charge the channel of the NAND string when a bit line voltage is applied. For example, in the bit line subset BL-SB0, BL0 is in communication with DSE0 to DSE3 but not DSE4 to DSE7. In another bit line subset, BL1 is in communication with DSE4 to DSE7 but not DSE0 to DSE3.

For example, assume a first BL subset (associated with BL0) has an uninhibited status and is therefore not inhibited from being erased in a current erase iteration, and a second BL subset (associated with BL1) has an inhibited status and is therefore inhibited from being erased in the current erase iteration. A sufficiently high erase voltage is applied to BL0 to allow charging of the channels of the NAND strings in the first BL subset, while a lower voltage is applied to BL1 to substantially prevent or discourage charging of the channels of the NAND strings in the second BL subset.

FIG. 3E depicts an example of the word line subset WL3D-SB of FIG. 2B for drain-sides of U-shaped NAND strings, consistent with FIG. 3A and 3B.

This subset includes memory cells which are associated with one (e.g., exactly one) word line or word line portion. In one implementation, which can include the U-shaped NAND string or the straight NAND string configuration, this subset includes one (e.g., exactly one) memory cell in each NAND string of a block or other set. In the U-shaped NAND string configuration, each NAND string has memory cells in a source-side or drain-side. For example, the memory cells of a NAND string can be divided equally between the source-side and drain-side. As mentioned, a conductive layer can include two independent conductive portions. In a given level of a 3D non-volatile memory device, a word line subset for one of the conductive portions can include one (e.g., exactly one) memory cell on the drain-side of each NAND string in a block or other set. WL3D-SB is an example of such a subset. Other examples at lower conductive layers are WL2D-SB, WL1D-SB and WL0D-SB (not shown).

Note that WL3D-SB includes memory cells which are shared with other subsets. For example, CG3 (MC303), CG11 (MC315 and MC319), CG19 (MC331) are shared with BL-SB0. Also, CG23 (MC343), CG31 (MC355 and MC359) and CG39 (MC371) are shared with the BL subset of BL1. WL3D-SB is not in communication with control gates at other levels of the memory device, or with control gates of source-side memory cells at the same level, as shown in FIG. 3F.

The memory cells of a word line subset can be inhibited together from being erased by control of the word line. The memory cells of one word line subset can be inhibited independently from the memory cells of another word line subset, at the same level or a different level of the memory device. The word line or word line portion is in communication with the control gate of each source-side or drain-side memory cell at the layer and can inhibit erase such as by floating a voltage on the word line so that an erase of the memory cell is prevented or discouraged. The erase action for a memory cell occurs when the NAND string channel is charged up and the control gate of the memory cell is driven lower. By floating the control gate of the memory cell and not driving it lower, the erase action does not occur.

For example, assume a first word line subset (e.g., WL3D-SB) has an uninhibited status and is therefore not inhibited from being erased in a current erase iteration, and a second word line subset (e.g., WL2D-SB, one level below WL3D-SB, and in communication with MC302, MS314, MS318, MC330, MC342, MS354, MS358 and MC370) has an inhibited status and is therefore inhibited from being erased in the current erase iteration. When an erase voltage is applied to a bit line to charge up the channels of the NAND strings, the word line of the first word line subset can be controlled by driving its voltage lower to allow an erase of the memory cells of the first word line subset, while the word line of the second word line subset can be controlled by floating its voltage to prevent erase of the memory cells of the second word line subset.

In another example, assume the first word line subset is WL3D-SB with an uninhibited status and the second word line subset is WL3S-SB (FIG. 3F), at the same level as WL3D-SB and in communication with MC307, MS311, MS323, MC327, MC347, MS351, MS363 and MC367) has an inhibited status and is therefore inhibited from being erased in the current erase iteration. When an erase voltage is applied to a bit line to charge up the channels of the NAND strings, the word line of the first word line subset can be controlled by being driven lower to allow an erase of the memory cells of the first word line subset, while the word line of the second word line subset can be controlled by being floated to prevent erase of the memory cells of the second word line subset.

FIG. 3F depicts an example of the word line subset WL3S-SB of FIG. 2B for source-sides of U-shaped NAND strings, consistent with FIGS. 3A and 3B. In a given level of a 3D non-volatile memory device, WL3S is an example of a word line subset for one of the conductive portions which includes one (e.g., exactly one) memory cell on the source-side of each NAND string in a block or other set. Other examples at lower conductive layers are WL2S-SB, WL1S-SB and WL0S-SB.

Note that WL3S-SB includes memory cells which are shared with other subsets. For example, CG7 (MC307 and MC311) and CG15 (MC323 and MC327) are shared with BL-SB0. Also, CG27 (MC347 and MC351) and CG35 (MC363 and MC367) are shared with the BL subset of BL1.

In one approach, WL3S-SB is not in communication with control gates at other levels of the memory device, or with control gates of drain-side memory cells at the same level, as shown in FIG. 3E.

The ability to independently erase or inhibit a word line subset of memory cells can be achieved as discussed above in connection with FIG. 3E.

FIG. 3G depicts an example arrangement of memory cells consistent with the circuit of U-shaped NAND strings of FIGS. 3A and 3B, as discussed. See also the discussion of FIG. 3B.

Figure 4A:
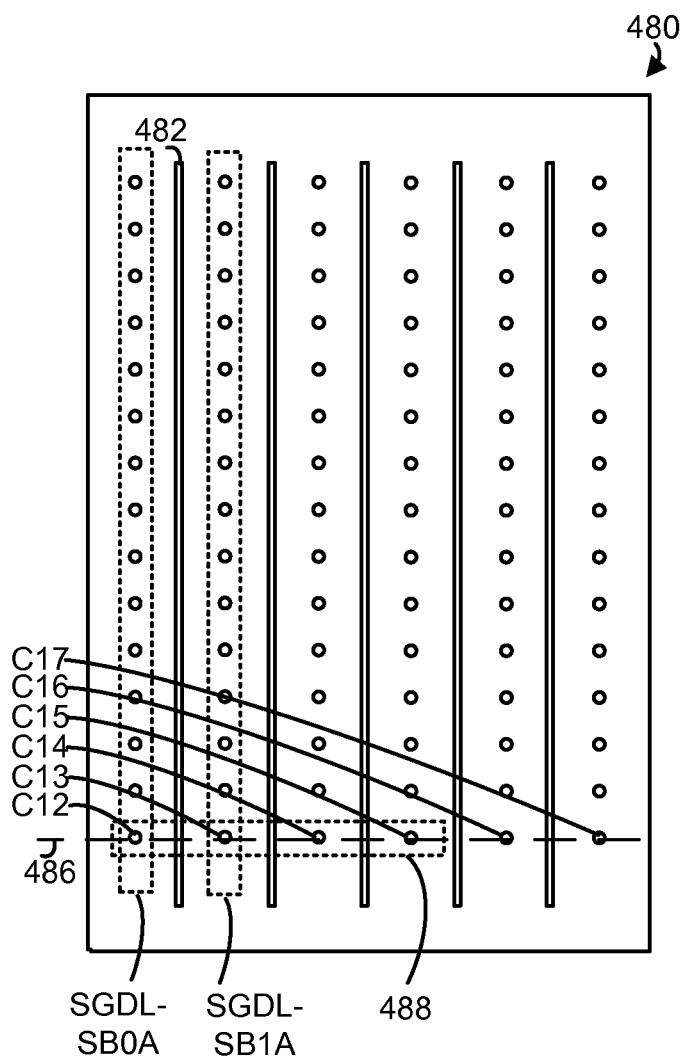
FIG. 4A depicts a top view of a straight NAND string embodiment 480 of the block BLK0 of FIG. 1A, showing example SGD line subsets SGDL-SB0A and SGDL-SB1A and example bit line subsets.
Figure 4B:
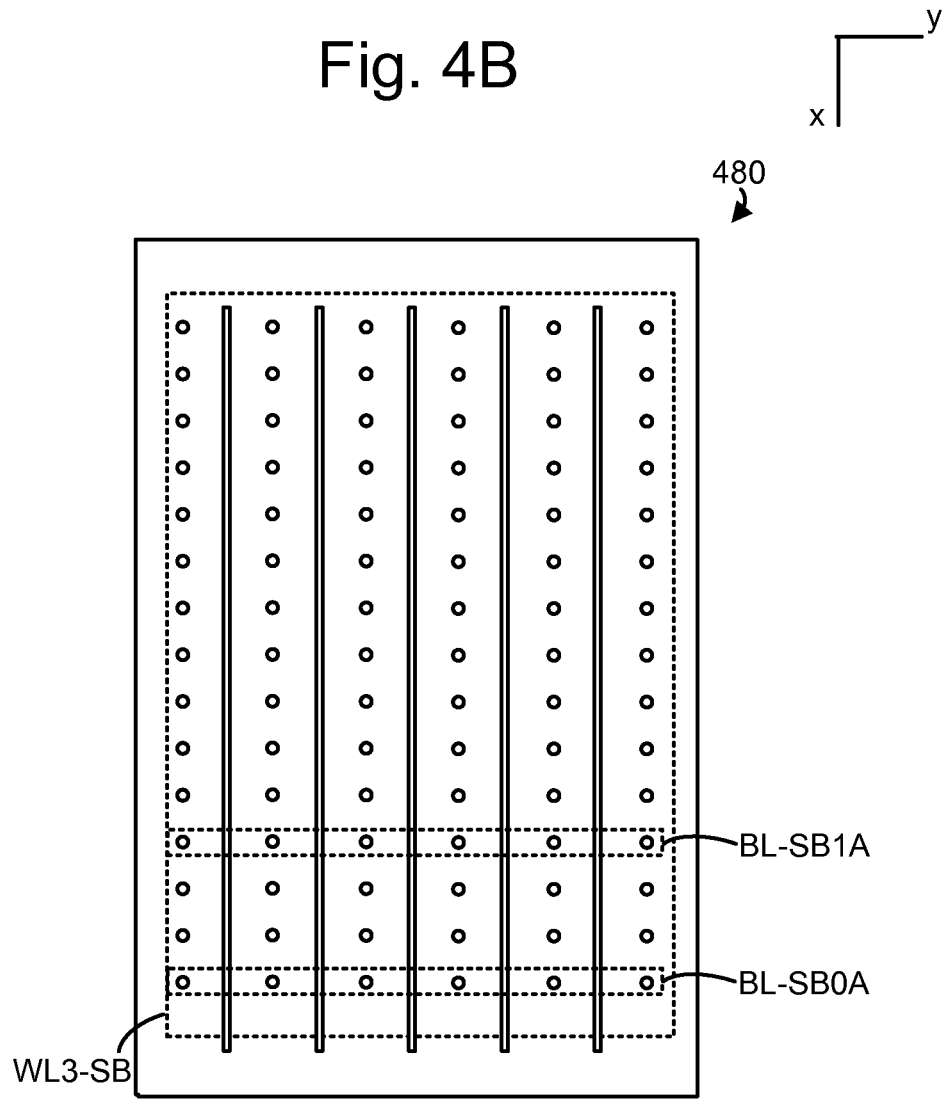
FIG. 4B depicts the block BLK0 of FIG. 4A, showing an example WL line subset WL3-SB and example bit line subsets BL-SB0A and BL-SB1A.

FIG. 4A depicts a top view of a straight NAND string embodiment 480 of the block BLK0 of FIG. 1A, showing example SGD line subsets SGDL-SB0A and SGDL-SB1A. In this configuration, a NAND string has only one column, and the source-side select gate is on the bottom of the column instead of on the top, as in a U-shaped NAND string. Moreover, a given level of a block has one word line layer which is connected to each of the memory cells of the layer. For example, FIG. 4B depicts the block BLK0 of FIG. 4A, showing an example WL line subset WL3-SB and example bit line subsets BL-SB0A and BL-SB1A. A number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C12 to C17. A cross-sectional view along line 486 of portion 488 is shown in FIG. 4C.

FIG. 4C depicts a cross-sectional view of the portion 488 of the block 480 of FIG. 4A along line 486. Columns of memory cells corresponding to NAND strings NS8 to NS11 are depicted in the multi-layer stack. The stack 490 includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS8 has a source end 494 and a drain end 492. The slit 482 from FIG. 4A is also depicted with other slits. A portion of the bit line BL0A is also depicted. Dashed lines depict memory cells and select gate transistors.

Figure 4D:
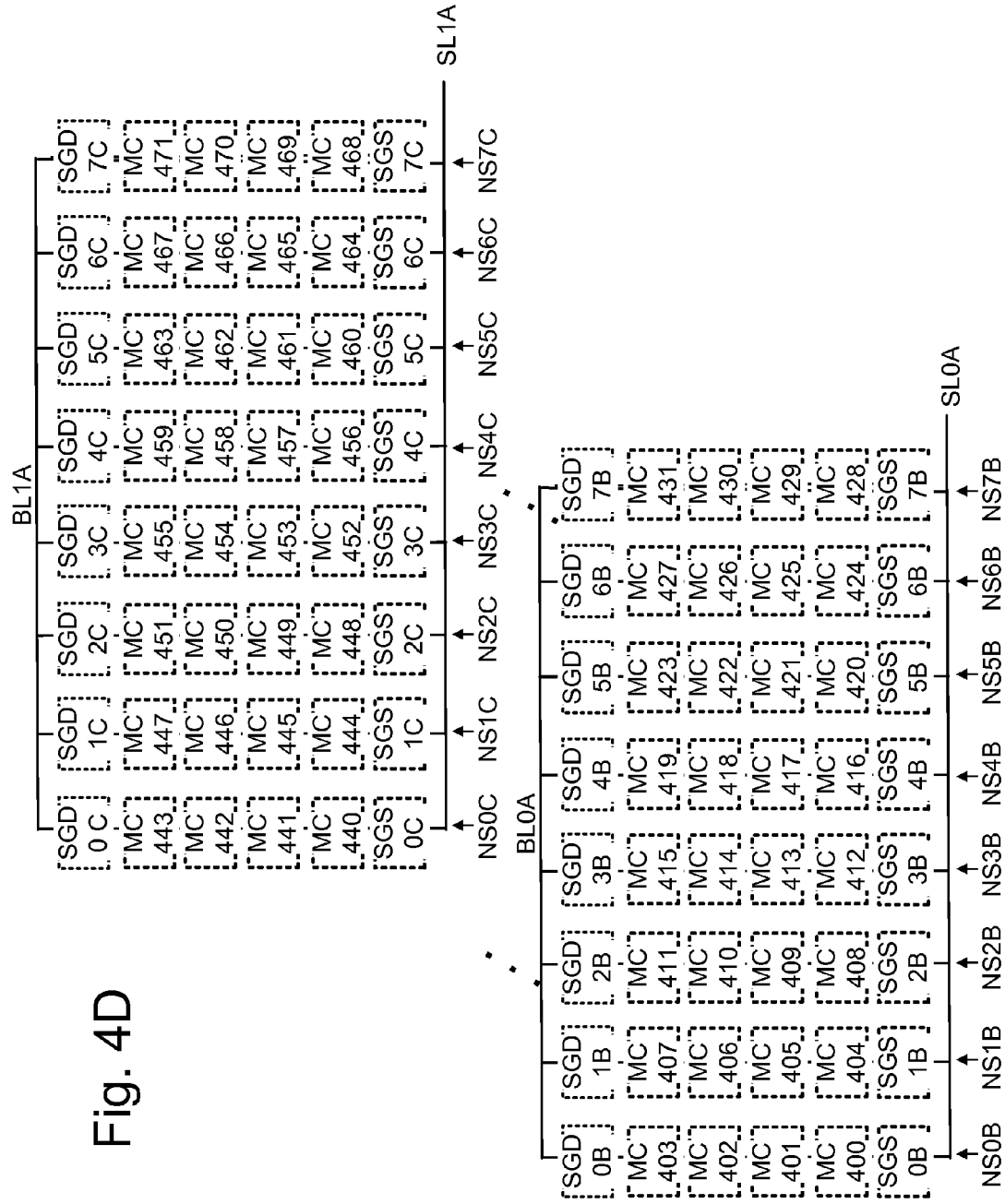
FIG. 4D depicts an example arrangement of memory cells consistent with the circuit of straight NAND strings of FIG. 4A.

FIG. 4D depicts an example arrangement of memory cells consistent with the circuit of straight NAND strings of FIG. 4A. One example bit line subset is represented by the memory cells of the NAND strings NS0B-NS7B which are in communication with a bit line BL0A and a source line SL0A, and another example bit line subset is represented by the memory cells of the NAND strings NS0C-NS7C which are in communication with a bit line BL1A and a source line SL1A. In one bit line subset, the NAND strings and their memory cells are: NS0B (MC400-MC403), NS1B (MC404-MC407), NS2B (MC408-MC411), NS3B (MC412-MC415), NS4B (MC416-MC419), NS5B (MC420-MC423), NS6B (MC424-MC427), and NS7B (MC428-MC431). In the other bit line subset, the NAND strings and their memory cells are: NS0C (MC440-MC443), NS1C (MC444-MC447), NS2C (MC448-MC451), NS3C (MC452-MC455), NS4C (MC456-MC459), NS5C (MC460-MC463), NS6C (MC464-MC467), and NS7C (MC468-MC471).

Further, eight example SGD line subsets are represented by NS0B and NS0C (and any NAND strings between them), NS1B and NS1C (and any NAND strings between them), NS2B and NS2C (and any NAND strings between them), NS3B and NS3C (and any NAND strings between them), NS4B and NS4C (and any NAND strings between them), NS5B and NS5C (and any NAND strings between them), NS6B and NS6C (and any NAND strings between them), and NS7B and NS7C (and any NAND strings between them).

Further, an example word line subset at a first word line level (WL0) is represented by: MC400, MC404, MC408, MC412, MC416, MC420, MC424, MC428, MC440, MC444, MC448, MC452, MC456, MC460, MC464 and MC468. An example word line subset at a second word line level (WL1) is represented by: MC401, MC405, MC409, MC413, MC417, MC421, MC425, MC429, MC441, MC445, MC449, MC453, MC457, MC461, MC465 and MC469. An example word line subset at a third word line level (WL2) is represented by: MC402, MC406, MC410, MC414, MC418, MC422, MC426, MC430, MC442, MC446, MC450, MC454, MC458, MC462, MC466 and MC470. An example word line subset at a fourth word line level (WL3) is represented by: MC403, MC407, MC411, MC415, MC419, MC423, MC427, MC431, MC443, MC447, MC451, MC455, MC459, MC463, MC467 and MC471.

Each NAND string includes a SGD transistor between its memory cells and the bit line, and a SGS transistor between its memory cells and the source line. The SGD and SGS transistors for the NAND strings are: NS0B (SGD0B and SGS0B), NS1B (SGD1B and SGS1B), NS2B (SGD2B and SGS2B), NS3B (SGD3B and SGS3B), NS4B (SGD4B and SGS4B), NS5B (SGD0B and SGS0B), NS6B (SGD0B and SGS0B), NS7B (SGD0B and SGS0B), NS0C (SGD0C and SGS0C), NS1C (SGD1C and SGS1C), NS2C (SGD2C and SGS2C), NS3C (SGD3C and SGS3C), NS4C (SGD4C and SGS4C), NS5C (SGD0C and SGS0C), NS6C (SGD0C and SGS0C), and NS7C (SGD0C and SGS0C).

FIG. 5 depicts a flowchart of an example erase process using selective inhibiting of cells, where there is one type of subset of cells. As discussed, examples types of subsets include a SGD line subset, WL subset and BL subset. One or more types of subsets can be defined and used for an erase operation.

Subsets of memory cells can be independently inhibited from being further erased in a remainder of an erase operation, once the subsets reach a verify condition. As a result, problems relating to over-erase can be reduced or avoided. Once a subset of memory cells meets a verify condition, the memory cells will not see the subsequent erase signals. This approach can tighten erase distributions, avoid over-stressing the verified memory cells, prevent deep-erased memory cells and minimize a transverse field. If deep-erased occurs, excess holes were stored in the erased cells. And, if neighboring cells are the programmed cells, excess electrons were stored in the programmed cells. Since the charge trapping layer is connected through entire string, a transverse field will develop within the charge trapping layer due to excess holes in the erased cells and excess electrons in the programmed cells.

Moreover, in some cases, it may not be necessary to use soft program after erase to minimize deep-erase impacts on the device performance.

Step 500 begins the erase operation for a set of cells comprising one type of subset. The set may be a block of cells, for instance. Status data can be maintained for each subset indicating whether the subset has a status of "inhibited," which indicates that the subset is to be inhibited from further erasing in the erase portion of a successive erase iteration of the erase operation, or a status of "uninhibited," which indicates that the subset is not to be inhibited from further erasing in the erase portion of a successive erase iteration of the erase operation (that is, the subset is to continue to undergo erasing). The status data can be maintained by the on-chip control circuitry 110 or the off-chip controller 122, for instance, and updated based on results of a verify test of each erase iteration.

As mentioned at the outset, a relatively strong erase voltage is needed to erase the cells at the highest data states, and this can result in a deep-erase phenomenon. Even if soft programming after erase could replace most excess holes with electrons, the degradation due to over stress caused by the strong erase condition might be permanent. An erase with verify algorithm with a pre-defined allowed number of fail bits might be able to minimize the permanent degradation. However, if the passed bits (e.g., the memory cells which meet a verify condition based on a verify test) are not inhibited, they would still see the subsequent erase signals and be over-erased. Techniques provided herein allow for passed bits to be inhibited during subsequent erase signals to reduce or avoid this problem.

Step 502 initializes Verase, the peak voltage which is applied to a bit line in a one-sided erase operation, or to both a bit line and a source line in a two-sided erase operation. Optionally, Vgidl is also initialized as discussed, e.g., in connection with FIG. 9A.

Step 504 performs an erase iteration for the subsets with status=uninhibited. These subsets undergo erasing. Step 506 performs a verify test for the subsets with status=uninhibited. The verify test indicates which memory cells have a Vth below a verify voltage, Vv-erase. A memory cell is considered to pass the verify test when its Vth is below Vv-erase, and a memory cell is considered to fail the verify test when its Vth is not below Vv-erase. A fail bit count can be provided which indicates a number of memory cells in a subset which fail the verify test. Or, a pass bit count can be provided which indicates a number of memory cells in a subset which pass the verify test.

Decision step 508 determines if a verify condition is met for the set of memory cells. For example, a verify condition may be met when there are ≤N1 fail bits, where N1 is a natural number. For example, N1 may be 1-10% of the total number of memory cells in the set. If decision step 508 is true, the operation ends successfully at step 520. If decision step 508 is false, decision step 510 determines if Verase=Verase_max, where Verase_max is a maximum allowable voltage. To avoid damage, this voltage is limited to a maximum. If decision step 510 is true, the erase operation ends unsuccessfully at step 520. If decision step 510 is false, decision step 512 determines if any cells (in the subsets having a status=uninhibited) pass the verify test. If decision step 512 is false, then Verase is stepped up at step 522 and a next erase iteration is performed at step 504. Step 522 optionally steps up a voltage referred to as Vgidl, as described further, e.g., in connection with FIG. 9A.

If decision step 512 is true, step 514 considers the result of the verify test for a subset. The result can indicate the number of fail bits in the subset, for instance. At step 516, if the subset meets a respective verify condition (e.g., a first verify condition), the status of the subset is set to inhibited. As a result, the subset of memory cells (e.g., a first subset) will be inhibited from being erased in a remainder of the erase operation, e.g., in an erase portion of a subsequent erase iteration of the erase operation. If the subset does not meet the respective verify condition, the status of the subset remains as uninhibited. The respective verify condition may be met, e.g., when the number of fail bits in the subset is less than a maximum allowable number.

The maximum allowable number of fails bit per subset can be the same for subsets of the same type, and different for each different type of subset, when there are different types of subsets. The maximum allowable number of fails bit per subset could also be set differently for different subsets of the same type, such as based on a position of the subset in a memory device. In one approach, the maximum allowable number of fails bit per subset could be higher for a subset which is relatively harder to erase, or lower for a subset which is relatively easier to erase. The difficulty with which a subset is erased may be based on factors such as location of the subset in the memory device, proximity to sensing circuitry, sources of interference, manufacturing variations, and other factors. Experimentation can indicate probabilistic measures of how difficult a subset is to erase. Further, the maximum allowable number of fails bit per subset could be adjusted based on a chronological lifetime of the memory device, a number of accumulated of program-erase, and/or conditions such as temperature.

For example, using the example, discussed in connection with FIG. 2B, assume there are 12 memory columns in the y direction, 32 k memory columns in the x direction, and four levels of memory cells with two word line portions per level, for a total of 1,536,000 cells in the set. Assume there are N1=1,536,000×2%=30,720 allowed fail bits in the set. The first type of subset is a BL subset and there are 32 k of these subsets, with 12×4=48 cells per subset. The second type of subset is a WL subset and there are 4×2=8 of these, with 32,000×12/2=192,000 cells per subset. The third type of subset is a SGD line subset and there are 6 of these, with 32,000×2×4=256,000 cells per subset. Using the ratio of 2%, the maximum allowable number of fail bits per BL subset is 48×0.02=1 bit, the maximum allowable number of fail bits per WL subset is 192,000×0.02=3,840 bits, and the maximum allowable number of fail bits per SGD line subset is 256,000×0.02=5,120 bits.

Note that due to overlap between subsets of different types, the same memory cell can be in two or three subsets of different types. If a memory cell is a fail bit, the fail bit will count toward the maximum allowable number of fail bits in each of the two or three subsets of different types, for a given erase-verify iteration.

If there is a next subset to consider at decision step 518, step 514 is repeated for the next subset. If decision step 518 is false, step 522, discussed previously, is reached.

Figure 6:
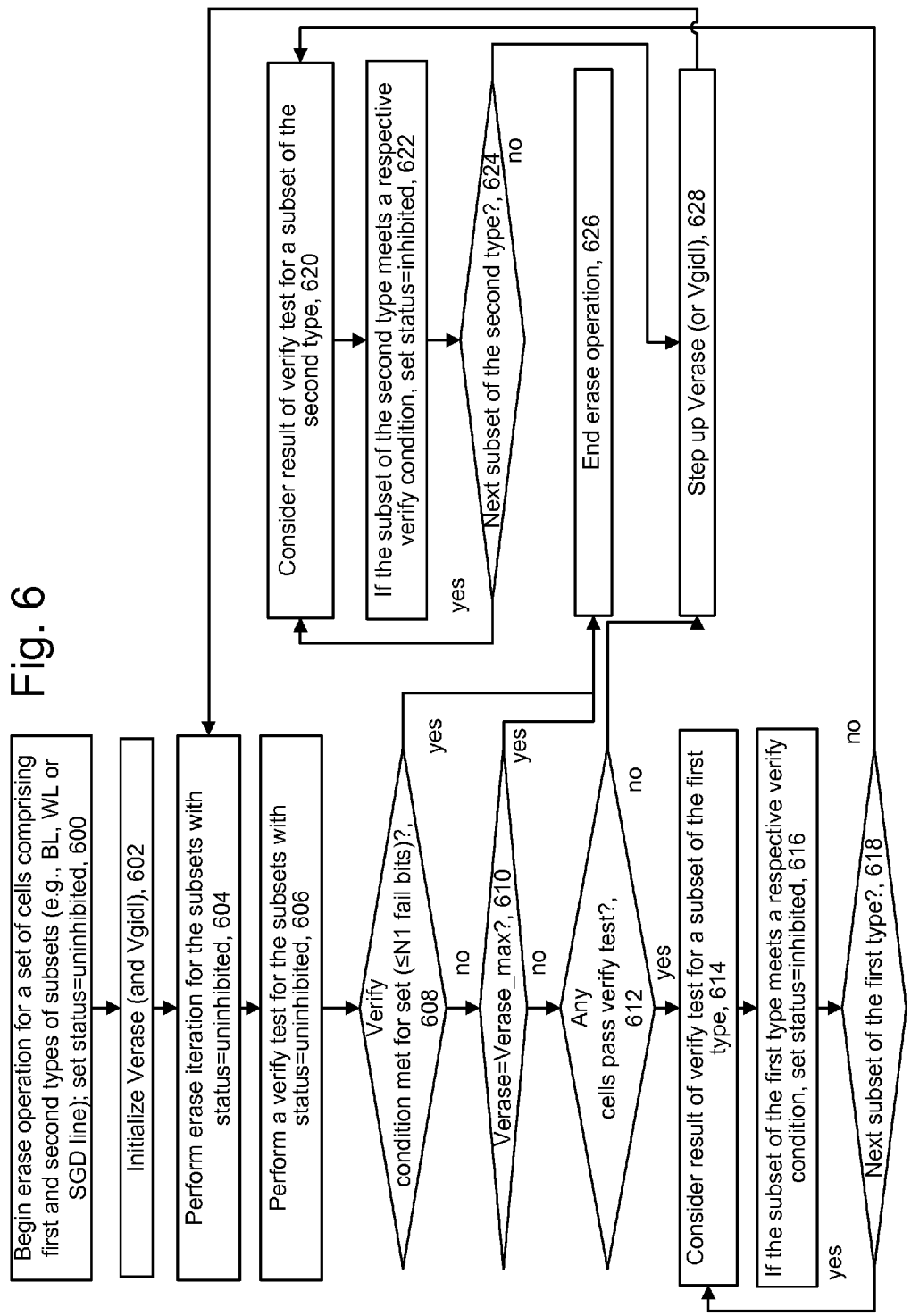
FIG. 6 depicts a flowchart of an example erase process using selective inhibiting of cells, where there are two types of subset of cells.

FIG. 6 depicts a flowchart of an example erase process using selective inhibiting of cells, where there are two types of subset of cells. Example scenarios for two types of subsets include: BL subset, then SGD line subset; BL subset, then WL subset; SGD line subset, then BL subset; SGD line subset, then WL subset; WL subset, then BL subset; and WL subset, then SGD line subset. The order refers to the order in which a decision is made to inhibit a subset. In some cases, the order may not be significant. However, experimentation and testing can determine if one order is preferable over another.

Step 600 begins the erase operation for a set of cells comprising first and second types of subsets (e.g., two of: BL, WL and SGD line subset). Step 602 initializes Verase. Optionally, Vgidl is also initialized as discussed, e.g., in connection with FIG. 9A.

Step 604 performs an erase iteration for the subsets with status=uninhibited. Step 606 performs a verify test for the subsets with status=uninhibited. Decision step 608 determines if a verify condition is met for the set of memory cells. If decision step 608 is true, the operation ends successfully at step 626. In a first option, the verify condition for a set can require all subsets to meet a respective verify condition. To illustrate, in the previous example, there are 8 WL subsets, the maximum allowable number of fail bits per WL subset is 3,840 bits per WL subset and the maximum allowable number of fail bits in the set is 30,720. The first option thus requires there to be no more than 3,840 fail bits per WL subset even if there are no more than 30,720 fail bits total in the set. In this case, if at least one WL subset has more than 3,840 fail bits, decision step 608 is false. In a second option with these facts, decision step 608 is true since the verify condition is based on the overall set. The first option is more lenient and avoids declaring the erase operation unsuccessful in some cases, while the second option is stricter and avoids a relatively large concentration of unerased cells in one subset.

If decision step 608 is false, decision step 610 determines if Verase=Verase_max. If decision step 610 is true, the erase operation ends unsuccessfully at step 626. If decision step 610 is false, decision step 612 determines if any cells (in the subsets having a status=uninhibited) pass the verify test. If decision step 612 is false, then Verase is stepped up at step 628 and a next erase iteration is performed at step 604. Step 628 optionally steps up Vgidl, as described further, e.g., in connection with FIG. 9A.

If decision step 612 is true, step 614 considers the result of the verify test for a subset of the first type. At step 616, if the subset meets a respective verify condition (e.g., a first verify condition), the status of the subset is set to inhibited. If the subset does not meet the respective verify condition, the status of the subset remains as uninhibited. The respective verify condition may be met, e.g., when the number of fail bits in the subset is less than a maximum allowable number. The respective verify condition can different for each different type of subset. For example, maximum allowable number of fail bits can have one value for one type of subset (e.g., one of BL, WL and SGD line subset) and another, different value for another type of subset (e.g., another of BL, WL and SGD line subset).

For instance, a first type of subset which has more memory cells than a second type of subset may have a larger maximum allowable number of fail bits. Erase characteristics of the different types of subsets may differ, such that one type of subset is harder to erase than another type of subset, in which case a larger maximum allowable number of fail bits can be used for the harder to erase subset. However, other approaches can be used as well.

If there is a next subset of the first type to consider at decision step 618, step 614 is repeated for the next subset of the first type. If decision step 618 is false, step 620 considers the result of the verify test for a subset of the second type. At step 622, if the subset meets a respective verify condition (e.g., a second verify condition), the status of the subset is set to inhibited. If the subset does not meet the respective verify condition, the status of the subset remains as uninhibited. If there is a next subset of the second type to consider at decision step 624, step 620 is repeated for the next subset of the second type. If decision step 624 is false, step 628, as discussed, is reached.

Figure 7:
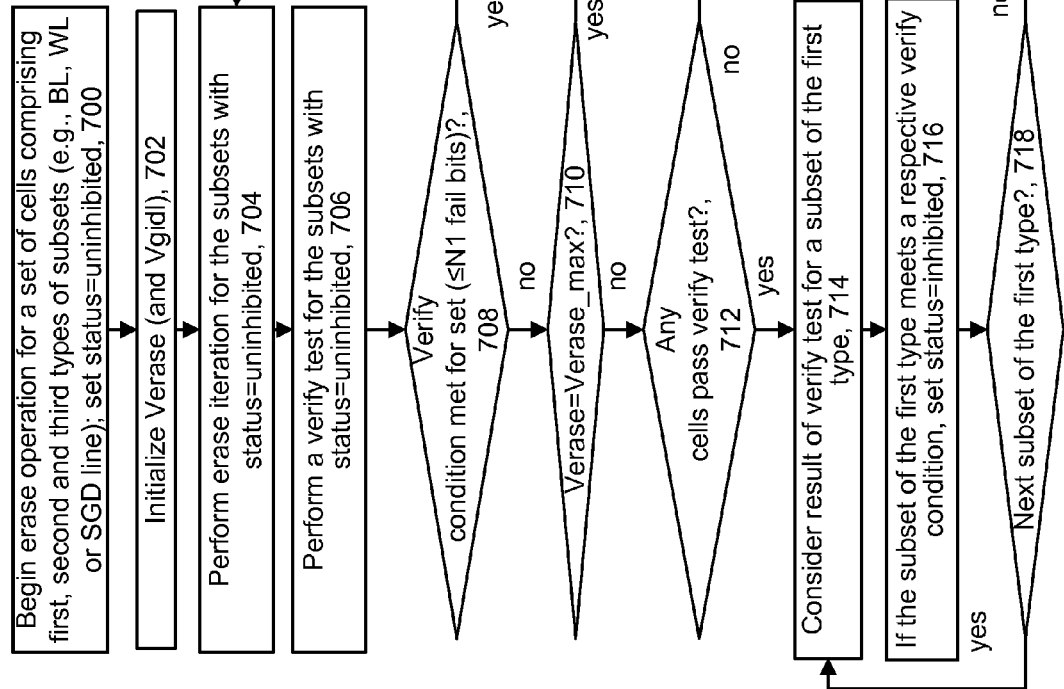
FIG. 7 depicts a flowchart of an example erase process using selective inhibiting of cells, where there are three types of subset of cells.

FIG. 7 depicts a flowchart of an example erase process using selective inhibiting of cells, where there are three types of subset of cells.

Example scenarios for three types of subsets include: BL subset, then SGD line subset, then WL subset; BL subset, then WL subset, then SGD line subset; SGD line subset, then WL subset, then BL subset; SGD line subset, then BL subset, then WL subset; WL subset, then BL subset, then SGD line subset; and WL subset, then SGD line subset, then BL subset. The order refers to the order in which a decision is made to inhibit a subset.

Step 700 begins the erase operation for a set of cells comprising first, second and third types of subsets (e.g., two of: BL, WL and SGD line subset). Step 702 initializes Verase. Optionally, Vgidl is also initialized as discussed, e.g., in connection with FIG. 9A.

Step 704 performs an erase iteration for the subsets with status=uninhibited. Step 706 performs a verify test for the subsets with status=uninhibited. Decision step 708 determines if a verify condition is met for the set of memory cells. If decision step 708 is true, the operation ends successfully at step 732. If decision step 708 is false, decision step 710 determines if Verase=Verase_max. If decision step 710 is true, the erase operation ends unsuccessfully at step 732. If decision step 710 is false, decision step 712 determines if any cells (in the subsets having a status=uninhibited) pass the verify test. If decision step 712 is false, then Verase is stepped up at step 734 and a next erase iteration is performed at step 704. Step 734 optionally steps up Vgidl, as described further, e.g., in connection with FIG. 9A.

If decision step 712 is true, step 714 considers the result of the verify test for a subset of the first type. At step 716, if the subset meets a respective verify condition (e.g., a first verify condition), the status of the subset is set to inhibited. If the subset does not meet the respective verify condition, the status of the subset remains as uninhibited.

If there is a next subset of the first type to consider at decision step 718, step 714 is repeated for the next subset of the first type. If decision step 718 is false, step 720 considers the result of the verify test for a subset of the second type. At step 722, if the subset meets a respective verify condition (e.g., a second verify condition), the status of the subset is set to inhibited. If the subset does not meet the respective verify condition, the status of the subset remains as uninhibited. If there is a next subset of the second type to consider at decision step 724, step 720 is repeated for the next subset of the second type.

If decision step 724 is false, step 726 considers the result of the verify test for a subset of the third type. At step 728, if the subset meets a respective verify condition (e.g., a third verify condition), the status of the subset is set to inhibited. If the subset does not meet the respective verify condition, the status of the subset remains as uninhibited. If there is a next subset of the third type to consider at decision step 730, step 726 is repeated for the next subset of the third type. If decision step 730 is false, step 734, as discussed, is reached.

FIG. 8 depicts an erase operation in which a number of different types of subsets of memory cells are adjusted in different erase iterations of an erase operation. Step 800 begins the erase operation for a set of cells using one type of subset. Step 802 switches to using two types of subsets when a first condition is met. Step 804 switches to using three types of subsets when a second condition is met. Generally, when a larger number of different types of subsets is used, there is a greater probability that one or more of the subsets will meet a respective verify condition and be inhibited from erase in a remainder of the erase operation. This is desirable since over-erase can be reduced and endurance improved. However, additional computations and erase time are needed as the number of subsets increases. The selection of the number of types of subsets to use in a given erase iteration or erase operation can be made based on a tradeoff between erase time and endurance damage. The more types of subsets, the greater the erase time but the less the endurance damage.

Accordingly, one approach is to gradually increase the number of different types of subsets as the erase operation progresses, and it is more likely that a greater number of memory cells have reached a respective verify condition. For example, the first and second conditions may be met when specified fixed number of erase iterations NE1 and NE2, respectively, have been performed, where N2>N1 and N1 and N2 are natural numbers (positive integers). Or, in an adaptive approach, the first and second conditions may be met when the number of fail bits falls below a specified number FB1 and FB2, respectively, where FB1>FB2 and FB1 and FB2 are natural numbers. Or, one condition, e.g., the first condition, may be fixed while the other, e.g., the second condition, is adaptive.

FIG. 9A depicts a flowchart of an example erase process in which Vgidl is stepped up in the erase portion of one or more successive erase-verify iterations. This approach can be used separately from, or incorporated into, the erase technique which inhibits subsets of cells, such as discussed in connection with FIGS. 5-8.

Step 900 begins an erase operation for a set of cells. Step 902 initializes Verase and Vgidl. Step 904 performs an erase iteration for the subsets with status=uninhibited. Step 906 performs a verify test for the set. Decision step 908 determines if a verify condition of ≤N1 fail bits is met for the set. If decision step 908 is true, the operation ends successfully at step 918. If decision step 908 is false, decision step 910 determines if Verase=Verase_max. If decision step 910 is true, the erase operation ends unsuccessfully at step 918.

Optionally, the erase operation can continue, and Vgidl can be allowed to increase, in one or more iterations when Verase_max is reached, as discussed in connection with FIG. 14.

If decision step 910 is false, decision step 912 determines if any cells in the set pass the verify test. If decision step 912 is false, then Verase, but not Vgidl, is stepped up at step 922 and a next erase iteration is performed at step 904. If decision step 912 is true, decision step 914 determines if a verify condition of ≤N2 fail bits is met for the set, where N2>N1 and N1 and N2 are natural numbers. If decision step 914 is false, step 920 optionally inhibits subsets of cells which meet a verify condition. Additional steps discussed previously, such as determining if individual subsets meet a respective verify condition, can be performed to determine if this is possible. Subsequently, step 922 is reached.

Decision step 914 being false indicates that many cells could not reach the erase verify level. Most likely, the tunneling field (erase voltage) is not large enough, so we increase Verase instead of Vgidl. If decision step 914 is true, decision step 916 determines if Vgidl=Vgidl_max. Decision step 914 being true indicates that only the slow erasing cells, whose Vth makes up the slower tail of the Vth distribution of the set of cells did not reach the erase verify level. Most likely, this is due to insufficient GIDL at certain NAND strings, so we increase Vgidl instead of Verase. In another option, Vgidl and Verase can be stepped up in the same erase iteration.

If decision step 916 is false, step 924 optionally inhibits subsets of cells which meet a verify condition. Vgidl, but not Verase, is stepped up at step 926 and a next erase iteration is performed at step 904. If decision step 916 is true, step 920 is reached.

Thus, two verify conditions are imposed. A first condition, at decision step 908 is a more strict condition which, if met, successfully ends the erase operation. A second condition, at decision step 914 is a less strict condition which, if met, indicates that many of the memory cells have been erased and the set is closed to being fully erased. For example, decision step 914 may be met when about 75% of the memory cells have been erased. N2, the maximum allowable number of fail bits, may be set to 25% of the number of cells in the set.

Thus, N1 and N2 are two different predefined fail bit counts. Once the verify condition of ≤N2 fail bits is met, the peak erase voltage (Verase) can be fixed in one or more successive erase iterations of the erase operation, while Vgidl, the GIDL voltage, which is the voltage difference of the gated junctions of the SGD and/or SGS select devices, is increased. With a higher GIDL voltage, bits might be able to each the erase verify condition in cases where the erase was limited by GIDL current. This approach can tighten the erase distribution and avoid an overstress of the gated junctions which would occur if Verase (which causes the GIDL voltage) was made excessively large. Moreover, in some cases, the highest Verase which is needed to complete the erase operation can be lower than Verase_max. See FIGS. 12-14 for further details.

In another option, Vgidl can begin stepping up at a fixed erase-verify iteration number which is a proxy for a verify condition being met. Or, Vgidl can begin stepping up at an erase-verify iteration which is based on a combination of the level of Verase and a verify condition. Or, Vgidl can begin stepping up when Verase_max is reached regardless of whether a verify condition is met (see FIG. 14).

FIG. 9B depicts threshold voltage distributions of a deep erased state, a final erased state and higher data states of one example erase operation. Memory cells can be programmed so that their threshold voltages are in respective ranges which represent data states. Initially, an erase operation is performed which places all of the memory cells in the erased state (E). Subsequently, some of the memory cells can be programmed to a higher threshold voltage such as to represent the A, B or C data states.

The x-axis indicates a threshold voltage and the y-axis indicates a number of storage elements. In this example, there are four data states (each represented by a threshold voltage distribution): an initial (deep) erased state 950, a soft programmed erased state (E) 952, an A state 954, a B state 956 and a C state 958. Memory devices with additional data states, e.g., eight or sixteen data states, can also be used. The distribution 950 is realized after the erase operation when storage elements are typically over-erased, past the erase state 952. In the erase operation, one or more erase pulses are applied to the NAND string at its source and/or drain ends, until the threshold voltage of the storage elements being erased transitions below an erase-verify level, Vv-erase which can be 0 V or close to 0V, in one approach. Once the erase operation is completed for a block, the soft programming operation can be performed, in which one or more positive voltage pulses are applied to the control gates of the storage elements, such as via a word line, to increase the threshold voltages of some or all of the storage elements in the distribution 950 closer to and below a soft programming (SPGM) verify level, Vv-spgm, to the erased state 952. For example, a certain, small fraction of the storage elements may be soft programmed to have a Vth above Vv-spgm, at which point the soft programing ends, leaving most of the other storage elements with a Vth which is close to, but below, Vv-spgm. Vv-spgm is typically above or equal to Vv-erase. The soft programming operation advantageously results in a narrow erase state distribution 952. Once the soft programming operation is complete, programming to higher data states can occur, such as to states A, B and C using verify levels VvA, VvB and VvC, respectively. A subsequent read operation can use the levels VreadA, VreadB and VreadC.

FIG. 9C depicts threshold voltage distributions of a soft erased state and higher data states of another example erase operation. In this approach, the erase state 960 is reached after a soft erase. In one option, no soft programming is performed. Vv-erase can be the same or different in FIGS. 9B and 9C.

FIG. 10A-10I depicts example voltages during the erase portion of an erase-verify iteration of an erase operation. An erase operation can include multiple erase-verify iterations, e.g., EV0, EV1, EV2, . . . such as discussed in connection with FIGS. 12-14. Each erase-verify iteration can include an erase portion (or iteration) followed by a verify portion (or iteration). Moreover, each erase portion can have multiple levels. In one approach, a two-level erase portion is used. Further, an erase operation can involve a one-sided or a two-sided erase. A one-sided erase applies a voltage to the drain-end of a NAND string via a bit line to charge up the NAND string, while the source-end of the NAND string is not used to charge up the NAND string. A two-sided erase charges up a NAND string via both the drain-end and the source-end. Two-sided, or both-sided erase is faster than one-sided erase but requires a larger chip size. Generally, the erase portion can include three parts: a preparation phase (t0-t2), a charge up phase (t2-t4) and an erase phase (t4-t7).

FIGS. 10A to 10I have a common time axis but the time increments are not necessarily equally spaced and the figures are not necessarily to scale.

FIG. 10A depicts example voltages for a bit line, for one- or two-sided erase. A selected bit line is in communication with memory cells or NAND strings which are to be erased in the current erase iteration, while an unselected bit line is not in communication with memory cells or NAND strings which are to be erased in the current erase iteration. For the selected bit line (waveform 1000), the voltage Vbl_selected is increased from Vss=0 V, for instance, to Vgidl at t0-t1, then increased from Vgidl to Verase at t2-t3, set at Verase from t3-t6, and then lowered from Verase to Vss at t6-t7. Increasing Vbl_selected from Vss=0 V to Vgidl causes holes to be generated at the SGD drain edge. For the unselected bit line (waveform 1002), the voltage Vbl_unselected is increased from Vss to Vbl_inhibit at t2-t3, set at Vbl_inhibit from t3-t6, then lowered from Vbl_inhibit to Vss at t6-t7. Example voltage levels are: Verase=15-20 V and Vgidl=10 V.

FIG. 10B depicts example voltages for a SGD transistor, for one- or two-sided erase. A selected SGD transistor is in communication with memory cells or NAND strings which are to be erased in the current erase iteration, while an unselected SGD transistor is not in communication with memory cells or NAND strings which are to be erased in the current erase iteration. For the selected SGD transistor (waveform 1006), the voltage Vsgd_selected is increased from Vss to Verase–Vgidl at t2-t3, set at Verase–Vgidl from t3-t6, then lowered from Verase–Vgidl to Vss at t6-t7. Verase–Vgidl denotes the difference between Verase and Vgidl. For the unselected SGD transistor (waveform 1004), the voltage Vsgd_unselected is increased from Vss to Verase–Vrev at t2-t3, set at Verase–Vrev from t3-t6, then lowered from Verase–Vrev to Vss at t6-t7. Verase–Vrev denotes the difference between Verase and Vrev. Example voltage levels are: Vrev=2-3 V, Verase–Vrev=17-18 V, Verase–Vgidl=10 V. "rev" denotes a reverse bias.

FIG. 10C depicts example voltages for a SGS transistor, for one-sided erase. For one-sided erase the SGS transistor is in a non-conductive state so that the source line does not communication with the NAND string. For the SGS transistor (waveform 1008), the voltage is increased from Vss to Vsgs_off at t0-t1, set at Vsgs_off from t1-t6, then lowered from Vsgs_off to Vss at t6-t7. Example voltage levels are: Vsgs_off=10 V.

FIG. 10D depicts example voltages for a SL, for one-sided erase. For the source line (SL) (waveform 1010), the voltage is increased from Vss to Vsl_com at t0-t1, set at Vsl_com from t1-t6, then lowered from Vsl_com to Vss at t6-t7. Example voltage levels are: Vsl_com=12 V. "sl_com" denotes a common or tied source line used for one-sided erase.

FIG. 10E depicts example voltages for a WL, for one- or two-sided erase. A selected word line (WL) is in communication with memory cells or NAND strings which are to be erased in the current erase iteration, while an unselected WL is not in communication with memory cells or NAND strings which are to be erased in the current erase iteration. For the selected WL (waveform 1014), the voltage Vwl_selected is allowed to float higher from Vss=0 V to a raised level at t2-t3, then maintained at the raised level from t3-t4, then driven lower from the raised level to Vss at t4-t5 and set at Vss from t5-t7. For the unselected WL (waveform 1012), the voltage Vwl_unselected is allowed to float higher from Vss=0 V to a raised level at t2-t3, then maintained at the raised level from t3-t6, then driven lower from the raised level to Vss at t6-t7. The raised level can be close to Verase. The WL voltage is floated higher due to capacitive coupling from Vpillar.

FIG. 10F depicts a pillar voltage, for one- or two-sided erase, showing an option where Vgidl is stepped up (dashed line). Vpillar, or Vchannel, is a representative voltage in a NAND string channel. If Vgidl is sufficiently high, e.g., 5 V or more, an increase in Vpillar may be seen from t1-t2 (waveform 1018). See also FIGS. 12-14, which show examples of increasing the level of Vgidl in successive erase iterations so that Vpillar can reach the charged up level sooner. When Verase is increased on the bit line from t2-t3, Vpillar is charged up, e.g., close to the level of Verase. For both selected and unselected WLs, Vpillar is maintained at the charged up level from t3-t6 and lowered back to Vss from t6-t7. Waveform 1016 represents the case where Vgidl is not sufficiently high to appreciably increase Vpillar from t1-t2. Instead, Vpillar is increased from t2-t3.

Specifically, Vbl has an initial level (Vgidl) and a final, peak level (Verase). Also, Vsgd (selected) has an initial level (0 V) and a final, peak level of Verase−Vgidl. Therefore, the potential difference between Vbl and Vsgd can be kept the same until the erase event completes. As for Vgidl, it can be 10 V, for instance. Since the gated junction is reversed biased at 10 V (the potential difference between Vbl and Vsgd), electron-hole pairs will be generated near the BL junctions. Electrons will be swept away by the electrical field and collected at BL terminals; while holes will float to the channel and help to charge up the channel potential. Given a sufficiently long pre-charge time, Vpillar will be boosted close to Vgidl from t1-t2 before being boosted further, close to Verase. Vpillar will reach its peak sooner when charging occurs between t1-t2. If Vgidl is not large enough, certain NAND strings might not be able to charge up to the final Vbl (Verase). Therefore, the tunneling field (or potential difference between Vchannel and Vss) which helps holes in the channel tunnel to the charge trapping layer is also not large enough. This problem can be avoided by stepping up Vgidl as described herein (see FIGS. 9A, 13 and 14).

FIG. 10G depicts a threshold voltage (Vth) of a memory cell being erased, for one- or two-sided erase. A decrease in Vth (waveform 1020) occurs from t4-t5 when the Vwl_selected is driven lower (waveform 1014). Vth is typically at some non-zero level, e.g., above 0 V, perhaps 1-6 V, in the A, B or C state.

Figure 10H:
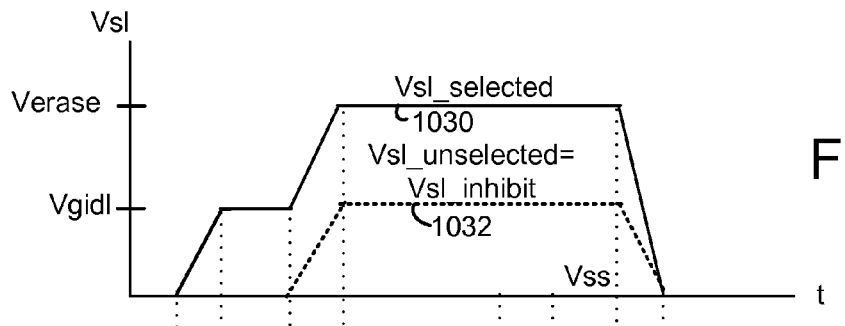

FIG. 10H depicts example voltages for a SL, for two-sided erase. A selected source line (SL) is in communication with memory cells or NAND strings which are to be erased in the current erase iteration, while an unselected SL is not in communication with memory cells or NAND strings which are to be erased in the current erase iteration. For two-sided erase, the SL voltages can be the same as Vbl. For the selected SL (waveform 1030), the voltage Vsl_selected is increased from Vss=0 V to Vgidl at t0-t1, then increased from Vgidl to Verase at t2-t3, set at Verase from t3-t6, and then lowered from Verase to Vss at t6-t7. Increasing Vsl_selected from Vss=0 V to Vgidl causes holes to be generated at the SGS source edge. For the unselected SL (waveform 1032), the voltage Vsl_unselected is increased from Vss to Vbl inhibit at t2-t3, set at Vbl inhibit from t3-t6, then lowered from Vbl inhibit to Vss at t6-t7.

Figure 10I:
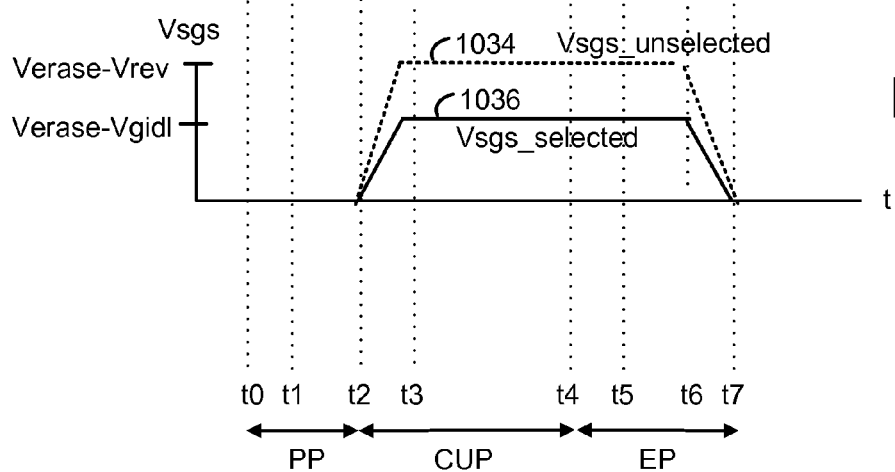

FIG. 10I depicts example voltages for a SGS transistor, for two-sided erase. A selected SGS transistor is associated with a NAND string having one or more memory cells which are to be erased in the current erase iteration, while an unselected SGS transistor is associated with a NAND string having no memory cells which are to be erased in the current erase iteration. For two-sided erase, the SGS transistor voltages can be the same as the SGD transistor voltages.

For the selected SGS transistor (waveform 1036), the voltage Vsgs_selected is increased from Vss to Verase−Vgidl at t2-t3, set at Verase−Vgidl from t3-t6, then lowered from Verase−Vgidl to Vss at t6-t7. For the unselected SGS transistor (waveform 1034), the voltage Vsgs_unselected is increased from Vss to Verase−Vrev at t2-t3, set at Verase−Vrev from t3-t6, then lowered from Verase−Vrev to Vss at t6-t7.

Generally, in a one-sided erase with inhibiting of passed bits, all SLs are tied together. A BL in communication with a subset of bits which have passed the verify level is called an unselected or inhibited BL, and a BL in communication with a subset of bits which need to undergo further erasing is called a selected BL. During the first (preparation) phase of the erase iteration, the selected BLs are biased at Vgidl (e.g., 10 V). Therefore, the gated junctions of the BL side select devices (the SGD transistors) see Vgidl and generate a GIDL current.

GIDL current at a select gate is determined by the bias difference (Vdg=Vd−Vg), between the drain voltage (Vd) and the gate voltage (Vg) of the select gate. The GIDL current density can be modeled by: $J=A*Es*\exp(-B/Es)$, where Es is the transverse electric field at the surface, and $Es=(Vdg+C)/Tox$. Thus, $J=A'*(Vdg+C)*\exp(-B7(Vdg+C))$, where A', B' and C are constants determined by some physical parameters. Normally, Vdg>>Vth of the select gate to obtain a considerable GIDL current. In one configuration, Vdg>5 V is needed to generate enough GIDL for an erase pulse width of about one msec. When Vdg is small, GIDL is negligible and is not able to charge-up the inhibited channel to cause erase.

The unselected BLs are biased at Vbl_inhibit. For instance, if a selected BL is biased at 20 V (Verase), to have a large enough GIDL current to charge up the channel, SGD might need to be biased at 10 V (Verase−Vgidl). If unselected BLs are biased at 0 V (Vss), the unselected SGD will be in a conductive state which will introduce severe leakage during erase.

The common SLs are biased at Vsl_com and the SGS transistors are biased at Vsgs_off. The SL bias (Vsl_com) can be slightly larger than the SGS bias (Vsgs_off), e.g., 12 V vs. 10 V, so that the channels are cutoff at the source sides of the NAND strings in communication with both the selected BLs and the unselected BLs, but with a small off leakage. To avoid punch-through occurring in SL side junction, Vsl_com and Vsgs_off are raised to a voltage (e.g., 10 V) which is about 10 V less than the boosted channel potential (e.g., 20 V).

During the second (charge up phase) of the erase iteration, the gated junctions of the BL side select devices (SGD transistor) of the selected BLs are kept at Vgidl so that hole generation is maintained and the pillar potential (Vpillar) is raised to nearly Verase. The unselected SGD transistors are biased at Verase−Vrev, and the unselected BLs are biased at Vbl_inhibit, whose level can be slightly higher than the unselected SGD transistor bias (Verase−Vrev), which might result in a small off leakage. Also, for an unselected NAND string in communication with a selected BL, there is a reverse bias (Vrev) on the gated junction, which also results in an off leakage. The reverse leakage (GIDL current) should be above about 10 pA to be able to fully charge up the channel and to avoid a situation in which the erase speed is not limited by GIDL current. Vrev biased at an appropriate level such as about 2-3 V should be able to eliminate fully charging up channel.

During the third phase (erase) of the erase iteration, the selected CG lines (WLs) are pulled down to Vss. In the selected strings, hole injection to the charge trap layer of the cell is accomplished. In the unselected strings in communication with selected BLs, for the bits which share the same CGs/WLs as bits in the selected strings, the gated junction bias at the BL sides is Vrev. This is not large enough to generate enough current to completely charge up the unselected channels. Even if the CGs are forced to Vss, an unselected string in communication with a selected BL might be inhibited from erase. Sometimes, the unselected channels might be able to get partially charged up with such an off leakage, however, erase speed might be limited by GIDL current. Therefore, an unselected string in communication with a selected BL might be partially inhibited from erase. For an unselected (inhibited) BL, since the BL bias (Vbl_inhibit) is barely larger than the SGD bias (Verase−Vrev), the leakage is not large enough to completely charge up the channels. Also, the BL bias is not large enough to disturb the inhibited bits. Therefore, the bits which have passed the erase verify level in the NAND strings in communication with the unselected BLs, are successfully inhibited.

A two-sided erase with inhibiting of passed bits is similar to the one sided case but with a few differences. For example, the SLs are independently controlled and not tied together. A SL in communication with bits which have passed the verify level is called an unselected or inhibited SL, and a SL with a bit which needs to undergo further erasing is called a selected SL. During the first phase of the erase iteration, the selected BLs and the selected SLs are biased at Vgidl (e.g., 10 V). Therefore, the gated junctions of the BL and SL side select transistors (SGD and SGS transistors, respectively) see Vgidl and generate a GIDL current from both sides of a NAND string. The unselected BLs and SLs are biased at Vbl_inhibit and Vsl_inhibit respectively.

During the second phase of the erase iteration, the gated junctions of the BL and SL side select devices (SGD and SGS transistors, respectively) are kept at Vgidl so that hole generation is maintained and the pillar potential is raised to nearly Verase. The unselected SGD and SGS transistors are biased at Verase−Vrev, and the unselected BLs and unselected SLs are biased at Vbl_inhibit and Vsl_inhibit, respectively. These levels can be slightly higher than the unselected SGD or SGS transistor bias (Verase−Vrev), which might result in a small off leakage. Also, for an unselected NAND string in communication with a selected BL or a selected SL, there is a reverse bias (Vrev) on the gated junction, which also results in an off leakage. The reverse leakage (GIDL current) should be above about 10 pA to be able to fully charge up the channel and to avoid a situation in which the erase speed is not limited by GIDL current. Vrev biased at an appropriate level such as about 2~3V V should be able to eliminate fully charging up channel.

During the third phase of the erase iteration, the selected CG lines (WLs) are pulled down to Vss. In the selected strings, hole injection to the charge trap layer of the cell is accomplished. In the unselected strings in communication with selected BLs or selected SLs, for the bits which share the same CGs/WLs as bits in the selected strings, the gated junction bias at the BL and WL sides is Vrev. This is not large enough to generate enough current to completely charge up the unselected channels. Even if the CGs are forced to Vss, an unselected string in communication with a selected BL might be able to get inhibited. Sometimes, the unselected channels might be able to get partially charged up with such an off leakage, however, erase speed might be limited by GIDL current. Therefore, an unselected string in communication with a selected BL or a selected SL might be partially inhibited. For an unselected (inhibited) BL or an unselected SL, since the BL bias (Vbl_inhibit) or SL bias (Vsl_inhibit, respectively) is barely larger than the SGD or SGS transistor bias (Verase−Vrev), the leakage is not large enough to completely charge up the channels. Also, the BL bias or SL bias is not large enough to disturb the inhibited bits. Therefore, the bits passing verify levels in the NAND strings in communication with the unselected BLs or unselected SLs, are successfully inhibited.

FIGS. 11A-11C depict voltages in the verify portion of an erase-verify iteration of an erase operation. FIG. 11A depicts a bit line voltage 1100. FIG. 11B depicts a SGS transistor and SGD transistor voltage 1102. FIG. 11C depicts an unselected word line voltage 1104 and a selected word line voltage 1106. During the verify portion, the selected sets of NAND strings are sensed using sensing circuitry to determine whether the threshold voltages of the selected memory cells have passed the verify test. During the sensing, Vbl is set to a sense voltage, Vsense (waveform 1100 in FIG. 11A). Vsgs and Vsgd (waveform 1102 in FIG. 11B) are set to a level such as Vsg which renders them conductive. Vsgs and Vsgd can be set to the same or different levels. Vwl_unselected (waveform 1104 in FIG. 11C) is set to a sufficiently high level, e.g., 8 V, to render the unselected memory cells in a conductive state. Vwl_selected (waveform 1106 in FIG. 11C) is set to Vv-erase. Sensing circuitry connected to a NAND string senses whether the NAND string is in a conductive state, which indicates the selected memory cells of the NAND string have been erased and therefore pass the verify test.

In one approach, the verify portion involves performing the verify test for the selected NAND strings which are connected to one BL (e.g., a BL subset) at a time. FIGS. 11A-11C have a common time axis but the time increments are not necessarily equally spaced and the figures are not necessarily to scale.

Figure 12:
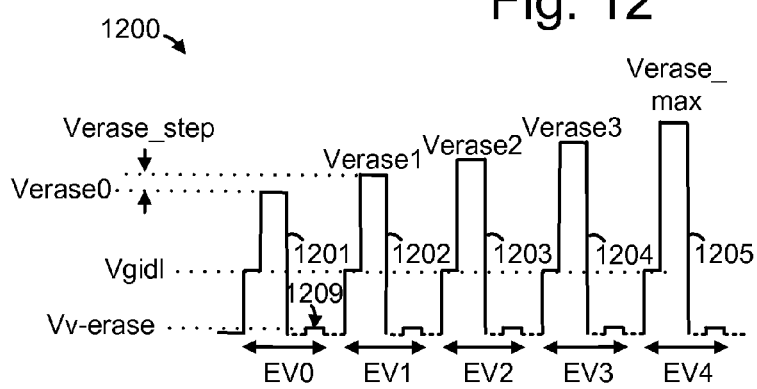
FIG. 12 depicts a series of erase pulses and verify pulses in an erase operation, where Verase is stepped up until Verase_max is reached, at which point the erase operation is concluded.

FIG. 12 depicts a series of erase pulses and verify pulses in an erase operation, where Verase is stepped up until Verase_max is reached, at which point the erase operation is concluded. A waveform 1200 represents a number of erase-verify iterations EV0, EV1, EV2, . . . . Each erase-verify iteration includes an erase pulse 1201-1205 followed by a verify pulse such as 1209 of magnitude Vv-erase. The erase pulses have two levels. A first level is Vgidl and a second level is Verase. In this example, Verase is stepped up in each iteration by a step size Verase_step so that erase pulse 1201 has a peak amplitude of Verase0, erase pulse 1202 has a peak amplitude of Verase1, erase pulse 1203 has a peak amplitude of Verase2, erase pulse 1204 has a peak amplitude of Verase3, and erase pulse 1205 has a peak amplitude of Verase_max, a maximum allowed level of Verase. In this case, the maximum erase voltage is reached relatively soon in the erase operation.

Figure 13:
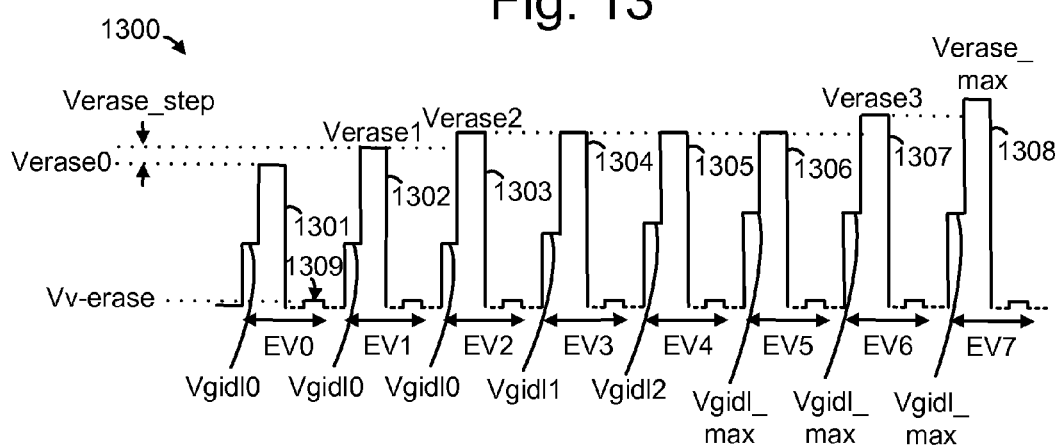
FIG. 13 depicts a series of erase pulses and verify pulses in an erase operation, where Verase is stepped up until a verify condition is met, then Vgidl is stepped up until Vgidl_max is reached, then Verase is stepped up again until Verase_max is reached, at which point the erase operation is concluded.

FIG. 13 depicts a series of erase pulses and verify pulses in an erase operation, where Verase is stepped up until a verify condition is met, then Vgidl is stepped up until Vgidl_max is reached, then Verase is stepped up again until Verase_max is reached, at which point the erase operation is concluded. A waveform 1300 represents a number of erase-verify iterations EV0, EV1, EV2, . . . . Each erase-verify iteration includes an erase pulse 1301-1308 or erase iteration followed by a verify pulse such as 1309 of magnitude Vv-erase. The erase pulses have two levels. A first, intermediate level is Vgidl and a second level is Verase. In this example, Verase is stepped up in some of the iterations (by a step size Verase_step). In particular, erase pulse 1301 has a peak amplitude of Verase0, erase pulse 1302 has a peak amplitude of Verase1, and erase pulse 1303 has a peak amplitude of Verase2. Additionally, Vgidl is fixed at a starting level of Vgidl0 in erase pulses 1301-1303. Verase is not stepped up in the next three erase-verify iterations. Instead, Vgidl begins to step up by a step size Vgidl_step, so that erase pulse 1304 has a level of Vgidl1, erase pulse 1305 has a level of Vgidl2, and erase pulse 1306 has a level of Vgidl_max, a maximum allowed level of Vgidl. The peak level of the erase pulse is Verase2 in erase-verify iterations 1304-1306. In the next erase-verify iterations 1307 and 1308, Verase is stepped up again, while Vgidl is fixed at Vgidl_max. Erase pulse 1307 has a peak level of Verase3 and erase pulse 1308 has a peak level of Verase_max. An advantage of this example the increasing level of Vgidl continues to erase the memory cells without increasing Verase to continue to move the cells closer to meeting a verify condition.

The step size for Vgidl can be fixed or varying. In one approach, the first step is relatively large compared to subsequent steps. Stepping up both Vgidl and Verase, in the same or different iterations, addresses the problem of slow-erasing bits without stressing the fast-erasing bits. One cause of slow-erasing bits is an insufficient GIDL current to charge up the channel, and this is addressed by stepping up Vgidl. An insufficient GIDL current may be caused by manufacturing variations in the select gate junction. Another cause of slow-erasing bits is an insufficient tunneling field, and this is addressed by stepping up Verase. An insufficient tunneling field may be caused by manufacturing variations in the MONOS.

Figure 14:
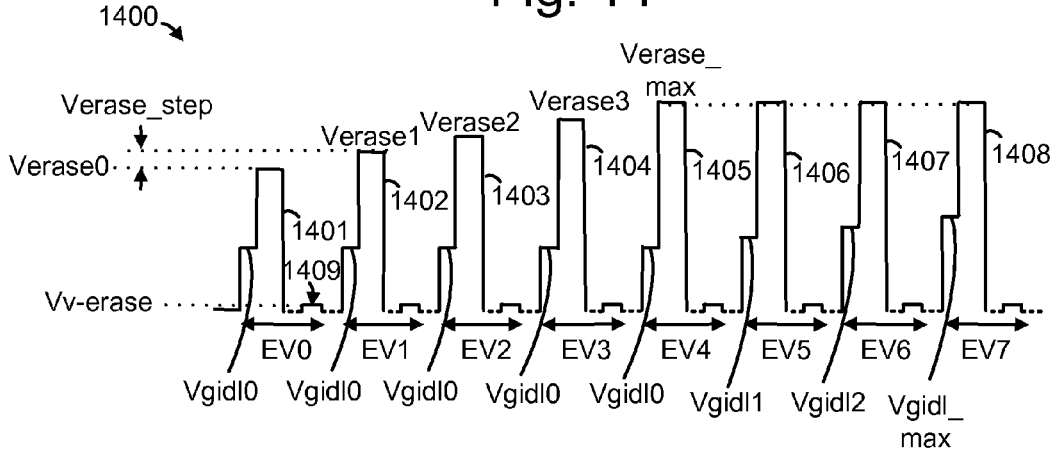
FIG. 14 depicts a series of erase pulses and verify pulses in an erase operation, where Verase is stepped up until Verase_max is reached, then Vgidl is stepped up until Vgidl_max is reached.

FIG. 14 depicts a series of erase pulses and verify pulses in an erase operation, where Verase is stepped up until Verase_max is reached, then Vgidl is stepped up until Vgidl_max is reached. In this case, the step up of Vgidl is not necessary based on meeting a verify condition. Instead, the step up of Vgidl is based on Verase reaching Verase_max. This approach uses additional iterations at Verase_max to attempt to successfully complete an erase operation. Verase is limited to prevent damage, while the increasing level of Vgidl continues to erase the memory cells to move the cells closer to meeting a verify condition. A waveform 1400 represents a number of erase-verify iterations EV0, EV1, EV2, . . . . Each erase-verify iteration includes an erase pulse 1401-1408 followed by a verify pulse such as 1409 of magnitude Vv-erase. The erase pulses have two levels. A first level is Vgidl and a second level is Verase. In this example, Verase is stepped up in successive iterations 1401-1405 (by a step size Verase_step) until Verase_max is reached. In the next iteration 1406, Vgidl begins stepping up in each successive iteration 1406-1408 until Vgidl_max is reached or until the verify condition is met.

Thus, performing each erase iteration can include raising a voltage of the bit line from a starting level (Vss) to an intermediate level (Vgidl), and raising the voltage of the bit line from the intermediate level (Vgidl) to a peak level (Verase). Further, when the voltage of the bit line is at the starting level and at the intermediate level, the control gate of the SGD transistor can be controlled to provide a gate-to-drain voltage of the SGD transistor which is sufficiently high to generate gate-induced drain leakage (GIDL) current in a NAND string. For the SGD transistor, a drain of the transistor is connected to, and in communication with, the bit line, and a source of the transistor is in communication with the NAND string channel. The gate-to-drain voltage is therefore Vsgd–Vbl. For the SGS transistor, a drain of the transistor is connected to, and in communication with, the source line, and a source of the transistor is in communication with the NAND string channel. The gate-to-drain voltage is therefore Vsgs–Vbl.

Performing each erase iteration further includes stepping up the intermediate level in at least one erase iteration (e.g., 1304-1306, 1406-1408) of the plurality of erase iterations.

The intermediate level (Vgidl) can be stepped up in successive erase iterations (e.g., 1304-1306, 1406-1408) of the plurality of erase iterations until the intermediate level reaches a respective maximum allowed level (Vgidl_max) or until the erase operation is concluded, whichever occurs first.

The intermediate level may not be stepped up in at least one erase iteration (e.g., 1302, 1303, 1402-1405) of the plurality of erase iterations before the at least one erase iteration of the plurality of erase iterations in which the intermediate level is stepped up.

The erase operation can include stepping up the peak level (Verase) in at least one erase iteration (e.g., 1302, 1303, 1402-1405) of the plurality of erase iterations before the at least one erase iteration of the plurality of erase iterations in which the intermediate level (Vgidl) is stepped up, and discontinuing the stepping up of the peak level during the at least one erase iteration of the plurality of erase iterations in which the intermediate level is stepped up.

The erase operation can include discontinuing the stepping up of the intermediate level and resuming the stepping up of the peak level (Verase) in a subsequent erase iteration (e.g., 1307, 1308) of the plurality of erase iterations, after the at least one erase iteration of the plurality of erase iterations in which the intermediate level is stepped up.

The erase operation can include continuing the stepping up of the peak level (Verase) after the resuming until the peak level reaches a respective maximum allowed level (Verase_max) or until the erase operation is concluded, whichever occurs first.

The discontinuing of the stepping up of the intermediate level can be responsive to the intermediate level reaching a respective maximum allowed level (Vgidl_max).

The erase operation can include performing a verify test for the set of memory cells; and determining a number of the memory cells which do not pass the verify test, where the stepping up of the intermediate level in the at least one erase iteration of the plurality of erase iterations occurs if the number of the memory cells which do not pass the verify test is below one maximum allowable number (N2). The erase operation can include concluding the erase operation for the set of memory cells if the number of the memory cells which do not pass the verify test is below another maximum allowable number (N1), which is less than the one maximum allowable number (N2).

The erase operation can include stepping up the peak level in successive erase iterations of the plurality of erase iterations until the peak level reaches a respective maximum allowed level (Verase_max), where the stepping up of the intermediate level in the at least one erase iteration of the plurality of erase iterations occurs in response to the peak level reaching the respective maximum allowed level.

The erase operation can include maintaining the gate-to-drain voltage of the SGD transistor below a maximum allowed voltage by controlling a voltage of the control gate of the SGD transistor when the voltage of the bit line is at the intermediate level and the peak level.

Further, the stepping up of the intermediate level in the at least one erase iteration of the plurality of erase iterations can occur at a predetermined erase iteration of the plurality of erase iterations.

Another option is to step up Vgidl and Verase during one or more same erase iterations.

Advantages of the techniques described herein include: the ability to lower the maximum verify level by omitting soft programming, and replacing the soft program verify level (Vv-spgm) with the erase level (Vv-erase), increasing read margin, reducing a possible transverse electrical field in connected SiN regions, reducing P/E cycle stress induced degradation, avoid over-erasing passed bits and tighten erase distribution, and avoid over stress of junctions of selected devices. Various implementation include: soft erase with inhibiting of subsets of passed bits, one-sided soft erase with inhibiting of subsets of passed bits, selective BL sub-block one-sided soft erase with inhibiting of subsets of passed bits; selective SGD line sub-block one-sided soft erase with inhibiting of subsets of passed bits; selective WL sub-block one-sided soft erase with inhibiting of subsets of passed bits; block one-sided soft erase with inhibiting of subsets of passed bits; two-sided soft erase with inhibiting of subsets of passed bits, selective SGD line sub-block both-sided soft erase with inhibiting of subsets of passed bits; selective WL sub-block both-sided soft erase with inhibiting of subsets of passed bits; selective block both-sided soft erase with inhibiting of subsets of passed bits, and controllable GIDL soft erase with inhibiting of subsets of passed bits.

In one embodiment, a method for performing an erase operation in a 3D stacked non-volatile memory device comprises: (a) performing each erase iteration of a plurality of erase iterations of the erase operation for a set of memory cells in at least one NAND string, the at least one NAND string comprises a drain-side end in communication with a bit line, and a select gate, drain (SGD) transistor, the SGD transistor comprises a drain in communication with the drain-side end, and the SGD transistor comprises a control gate, the performing each erase iteration comprising: (i) raising a voltage of the bit line from a starting level (Vss) to an intermediate level (Vgidl); (ii) raising the voltage of the bit line from the intermediate level (Vgidl) to a peak level (Verase); (iii) when the voltage of the bit line is at the starting level and at the intermediate level, controlling the control gate of the SGD transistor to provide a gate-to-drain voltage of the SGD transistor which is sufficiently high to generate gate-induced drain leakage (GIDL) current in the at least one NAND string; and (b) stepping up the intermediate level in at least one erase iteration of the plurality of erase iterations.

In another embodiment, a 3D stacked non-volatile memory device comprises: a bit line; a set of memory cells in at least one NAND string, the at least one NAND string comprises a drain-side end in communication with the bit line, and a select gate, drain (SGD) transistor, the SGD transistor comprises a drain in communication with the drain-side end, and the SGD transistor comprises a control gate; and a control circuit, the control circuit, to perform each erase iteration of a plurality of erase iterations of an erase operation for a set of memory cells: raises a voltage of the bit line from a starting level (Vss) to an intermediate level (Vgidl); raises the voltage of the bit line from the intermediate level (Vgidl) to a peak level (Verase); when the voltage of the bit line is at the starting level and at the intermediate level, controls the control gate of the SGD transistor to provide a gate-to-drain voltage of the SGD transistor which is sufficiently high to generate gate-induced drain leakage (GIDL) current in the at least one NAND string; and the control circuit steps up the intermediate level in at least one erase iteration of the plurality of erase iterations.

In another embodiment, a method for performing an erase operation in a 3D stacked non-volatile memory device comprises: performing an erase iteration of a plurality of erase iterations of the erase operation for a set of memory cells in at least one NAND string, the performing the erase iteration comprises raising a voltage of a bit line in communication with the at least one NAND string from a starting level (Vss) to an intermediate level (Vgidl), raising the voltage of the bit line from the intermediate level (Vgidl) to a peak level (Verase); performing a verify test for the set of memory cells; determining whether a verify condition is met based on the verify test, the verify condition indicating a progress of the set of memory cells in the erase operation; if the verify condition is met, stepping up the intermediate level in a next erase iteration of the plurality of erase iterations; and if the verify condition is not met, not stepping up the intermediate level in the next erase iteration of the plurality of erase iterations.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for performing an erase operation in a 3D stacked non-volatile memory device, comprising:

performing an erase iteration of a plurality of erase iterations of the erase operation for a set of memory cells in a NAND string, the performing the erase iteration comprises raising a voltage of a bit line in communication with the NAND string from a starting level (Vss) to an intermediate level (Vgidl), and raising the voltage of the bit line from the intermediate level (Vgidl) to a peak level (Verase);

performing a verify test for the set of memory cells;

determining whether a verify condition is met based on the verify test, the verify condition indicating a progress of the set of memory cells in the erase operation;

if the verify condition is met, stepping up the intermediate level in a next erase iteration of the plurality of erase iterations; and if the verify condition is not met, not stepping up the intermediate level in the next erase iteration of the plurality of erase iterations.

2. The method of claim 1, further comprising:

determining a number of the memory cells which do not pass the verify test, the verify condition is met of the number of the memory cells which do not pass the verify test is below a maximum allowable number (N2).

3. The method of claim 1, further comprising:
if the verify condition is met, stepping up the intermediate level in successive erase iterations of the plurality of erase iterations until a respective maximum allowed level is reached.

4. The method of claim 3, further comprising:
performing an additional erase iteration of the plurality of erase iterations after the respective maximum allowed level is reached.

5. A 3D stacked non-volatile memory device, comprising:
a bit line;
a set of memory cells in a NAND string, the NAND string is in communication with the bit line; and
a control circuit, the control circuit, to perform an erase iteration of a plurality of erase iterations of an erase operation for the set of memory cells, is configured to raise a voltage of a bit line in communication with the NAND string from a starting level (Vss) to an intermediate level (Vgidl), and raise the voltage of the bit line from the intermediate level (Vgidl) to a peak level (Verase), the control circuit is also configured to:
perform a verify test for the set of memory cells;
determine whether a verify condition is met based on the verify test, the verify condition indicating a progress of the set of memory cells in the erase operation;
if the verify condition is met, step up the intermediate level in a next erase iteration of the plurality of erase iterations; and
if the verify condition is not met, do not step up the intermediate level in the next erase iteration of the plurality of erase iterations.

6. The 3D stacked non-volatile memory device of claim 5, wherein the control circuit is also configured to:
determine a number of the memory cells which do not pass the verify test, the verify condition is met of the number of the memory cells which do not pass the verify test is below a maximum allowable number (N2).

7. The 3D stacked non-volatile memory device of claim 5, wherein the control circuit is also configured to:
if the verify condition is met, step up the intermediate level in successive erase iterations of the plurality of erase iterations until a respective maximum allowed level is reached.

8. The 3D stacked non-volatile memory device of claim 7, wherein the control circuit is also configured to:
perform an additional erase iteration of the plurality of erase iterations after the respective maximum allowed level is reached.

* * * * *